United States Patent
Gulati et al.

(10) Patent No.: US 11,018,707 B2
(45) Date of Patent: May 25, 2021

(54) ADAPTIVE GAIN CONTROL FOR SIDELINK COMMUNICATIONS

(71) Applicant: QUALCOMM Incorporated, San Diego, CA (US)

(72) Inventors: Kapil Gulati, Hillsborough, NJ (US); Junyl Li, Chester, NJ (US); Tien Viet Nguyen, Bridgewater, NJ (US); Subramanya Rao, Sunnyvale, CA (US); Sudhir Kumar Baghel, Hillsborough, NJ (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/778,664

(22) Filed: Jan. 31, 2020

(65) Prior Publication Data

US 2020/0313706 A1 Oct. 1, 2020

Related U.S. Application Data

(60) Provisional application No. 62/826,903, filed on Mar. 29, 2019.

(51) Int. Cl.
*H04B 1/10* (2006.01)
*H04B 17/00* (2015.01)
(Continued)

(52) U.S. Cl.
CPC ......... *H04B 1/1027* (2013.01); *H04B 17/318* (2015.01); *H04L 1/1829* (2013.01);
(Continued)

(58) Field of Classification Search
CPC ........... H04W 72/042; H04W 72/0406; H04W 72/0446; H04W 88/02; H04B 1/40;
(Continued)

(56) References Cited

U.S. PATENT DOCUMENTS

| 7,085,255 B2 | 8/2006 | Jacques et al. |
| 8,730,903 B2 * | 5/2014 | Seo .......... H04L 5/0082 370/329 |

(Continued)

FOREIGN PATENT DOCUMENTS

| EP | 1231721 A1 | 8/2002 |
| EP | 3404864 A1 | 11/2018 |

(Continued)

OTHER PUBLICATIONS

International Search Report and Written Opinion—PCT/US2020/016419—ISA/EPO—dated May 18, 2020.

*Primary Examiner* — Quochien B Vuong
(74) *Attorney, Agent, or Firm* — Holland & Hart LLP

(57) ABSTRACT

Methods, systems, and devices for wireless communications are described. A first user equipment (UE) may receive one or more transmissions from one or more UEs in a first slot, including a first transmission from a second UE. The first UE may receive the first transmission using a receiver configured with a first gain and may decode the first transmission. The UE may determine a correspondence (e.g., a temporal correlation) between the first slot and a second slot and may configure the receiver with a second gain at the beginning of the second slot based on the correspondence. The UE may determine that a total received signal power in the second slot is associated with the total received signal power in the first slot. The UE may decode one or more transmissions in the second slot based on the receiver having the second gain at the beginning of the slot.

50 Claims, 15 Drawing Sheets

(51) Int. Cl.
*H04B 17/318* (2015.01)
*H04W 72/04* (2009.01)
*H04L 1/18* (2006.01)
*H03F 3/19* (2006.01)
*H03G 3/30* (2006.01)
*H04W 92/18* (2009.01)

(52) U.S. Cl.
CPC ... *H04W 72/0406* (2013.01); *H04W 72/0446* (2013.01); *H03F 3/19* (2013.01); *H03F 2200/294* (2013.01); *H03F 2200/451* (2013.01); *H03G 3/3036* (2013.01); *H03G 2201/103* (2013.01); *H03G 2201/307* (2013.01); *H04W 92/18* (2013.01)

(58) Field of Classification Search
CPC ...... H04B 1/1027; H04B 7/26; H04B 17/318; H04B 17/336; H04B 17/345; H04L 1/0045; H04L 1/1829; H04L 5/0082
See application file for complete search history.

(56) References Cited

U.S. PATENT DOCUMENTS

| | | | |
|---|---|---|---|
| 9,661,658 B2* | 5/2017 | Li | H04W 72/085 |
| 9,942,877 B2 | 4/2018 | Kim | |
| 10,021,654 B2* | 7/2018 | Kim | H04B 17/318 |
| 10,644,833 B2* | 5/2020 | Sorrentino | H04L 5/0023 |
| 2017/0027011 A1 | 1/2017 | Chae et al. | |
| 2019/0281563 A1* | 9/2019 | Lee | H04W 72/0446 |
| 2020/0267661 A1* | 8/2020 | Park | H04B 17/327 |

FOREIGN PATENT DOCUMENTS

| | | |
|---|---|---|
| WO | WO-2013155253 A1 | 10/2013 |
| WO | WO-2018030949 A1 | 2/2018 |

\* cited by examiner

ADAPTIVE GAIN CONTROL FOR SIDELINK COMMUNICATIONS

CROSS REFERENCE

The present application for patent claims the benefit of U.S. Provisional Patent Application No. 62/826,903 by GULATI et al., entitled "ADAPTIVE GAIN CONTROL FOR SIDELINK COMMUNICATIONS," filed Mar. 29, 2019, which is assigned to the assignee hereof and expressly incorporated herein.

BACKGROUND

The following relates generally to wireless communications, and more specifically to adaptive gain control for sidelink communications.

Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple-access systems include fourth generation (4G) systems such as Long Term Evolution (LTE) systems, LTE-Advanced (LTE-A) systems, or LTE-A Pro systems, and fifth generation (5G) systems which may be referred to as New Radio (NR) systems. These systems may employ technologies such as code division multiple access (CDMA), time division multiple access (TDMA), frequency division multiple access (FDMA), orthogonal frequency division multiple access (OFDMA), or discrete Fourier transform spread orthogonal frequency division multiplexing (DFT-S-OFDM). A wireless multiple-access communications system may include a number of base stations or network access nodes, each simultaneously supporting communication for multiple communication devices, which may be otherwise known as user equipment (UE).

In some cases, a user equipment (UE) may receive transmissions from one or more UEs in a slot and may apply a gain as part of processing (e.g., decoding) the transmissions. In some cases, a power of the transmissions may be large enough to saturate a low noise amplifier (LNA) applying the gain. Saturation may inhibit an ability of the UE to decode the transmissions.

SUMMARY

The described techniques relate to improved methods, systems, devices, and apparatuses that support adaptive gain control for sidelink communications. Generally, the described techniques provide for a first user equipment (UE) to receive one or more transmissions from one or more UEs in a first slot, including a first transmission from a second UE. The first UE may receive the first transmission using a receiver configured with a first gain and may decode the first transmission. The UE may determine a correspondence (e.g., a temporal correlation, a spatial correlation, or both) between the first slot and a second slot (e.g., between transmissions in the first slot and expected transmissions in the second slot), and may configure the receiver with a second gain at the beginning of the second slot based on based on the correspondence. For instance, the UE may determine that a total received signal power in the second slot is associated with the total received signal power in the first slot. The UE may decode one or more transmissions in the second slot based on configuring the receiver to have the second gain at the beginning of the slot.

DETAILED DESCRIPTION

Figure 1:
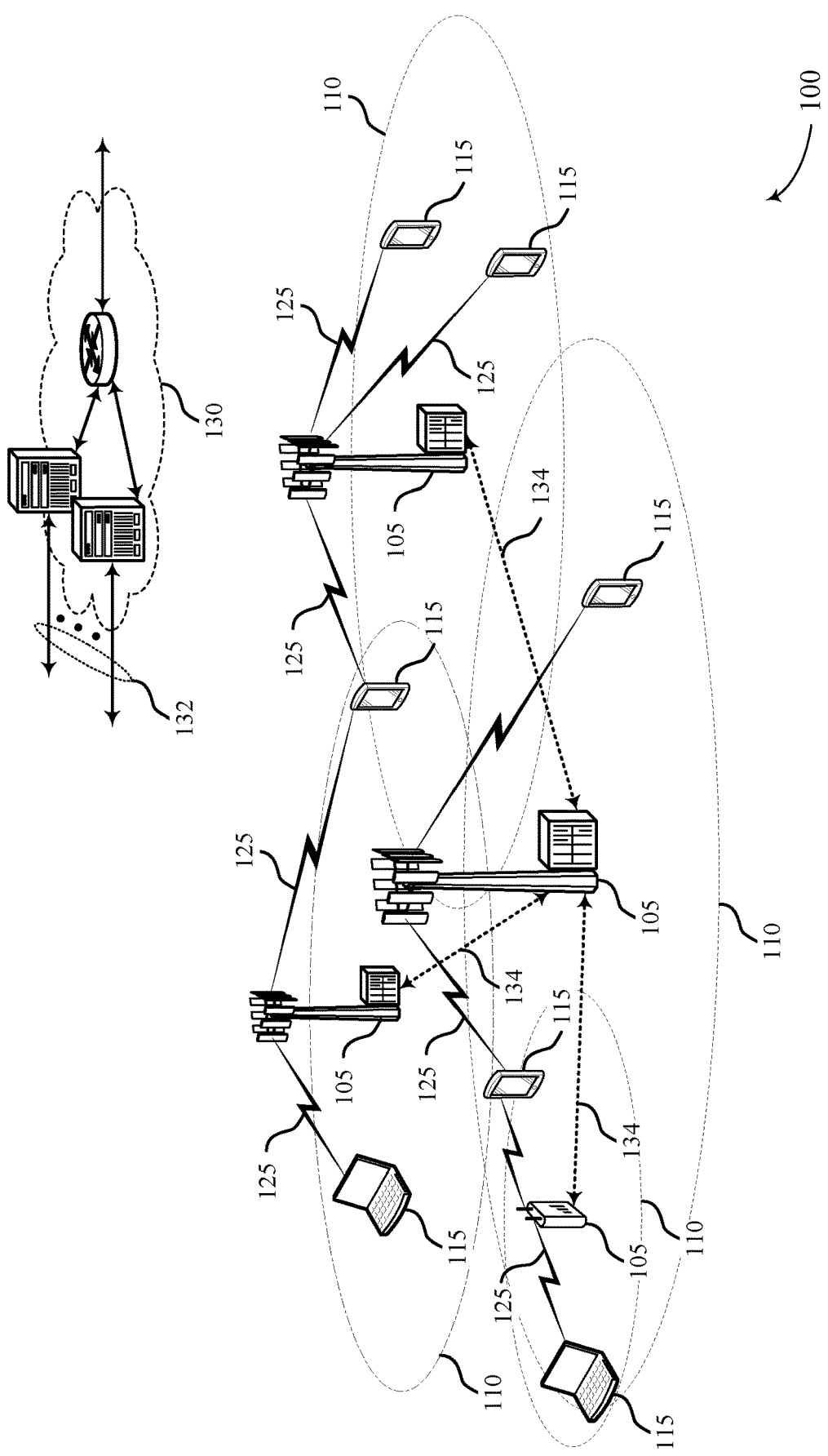
FIG. 1 illustrates an example of a wireless communications system that supports adaptive gain control for sidelink communications in accordance with aspects of the present disclosure.

A user equipment (UE) may receive transmissions from one or more UEs in a slot and may process (e.g., decode or attempt to decode) a transmission based on applying a gain to the transmissions (e.g., applying a gain to a signal derived from the transmissions). In some cases, a power of the transmissions may be high enough to saturate a low noise amplifier (LNA) applying the gain or may be low enough such that the transmissions go undetected or become undecodable. To prevent LNA saturation while maintaining sufficient gain for detection or decoding, the UE may perform adaptive gain control (AGC) at a start of the slot. In some cases, AGC may, additionally or alternatively, be referred to as automatic gain control. Performing AGC may involve the UE detecting a power of transmissions over one or more beginning symbols (e.g., a first symbol) of the slot and changing to another gain for the remaining symbols of the slot to receive a transmission. The gain which the UE uses for the remaining symbols of the slot may be configured to enable the UE to decode the transmissions of that slot without saturating the LNA. The UE may perform AGC at the start of each slot and may use a same default gain while performing AGC in an attempt to decode control or data information in the first symbol. The power of transmissions in each slot may vary from slot to slot, however—including but not limited to sidelink deployments in which the number and proximity of transmitted devices (e.g., UEs) may vary or otherwise be unpredictable from slot to slot—and, as such, the default gain may be too high and may enable or cause saturation of the LNA for the control or data information in the first symbol or may be too low and may not sufficiently amplify the control or data information in the first symbol for detection or decoding (or attempted decoding).

In some cases, a correspondence (e.g., a temporal correlation, a spatial correlation, or both) may exist between a first slot and a second slot (e.g., between transmissions in the first slot and expected transmissions in the second slot). In such cases, a UE may use a default gain at the start of the first slot and may use another gain at the start of the second slot based on the correspondence between the first slot and the second slot. For instance, a total received signal power (e.g., a received signal strength indicator (RSSI)) in the first slot may be associated with a total received signal power (e.g., another RSSI) in the second slot and the UE may determine a gain to use at the start of the second slot based on the association between the total received signal power in the first slot and the total received signal power in the second slot.

In one example, a first UE may receive a transmission from a second UE that spans multiple consecutive slots (e.g., a first slot and a subsequent second slot). In another example, the first UE may receive a transmission from the second UE in a first slot that indicates a reserved resource for a corresponding transmission (e.g., a retransmission) in a second slot. In either example, the UE may assume that a gain sufficient to decode the transmission in the first slot (e.g., the gain used after performing AGC in the first slot) may be sufficient to decode the first symbol of the transmission in the second slot and may use the gain at the start of the second slot. In such cases, the UE may use the gain in the second slot until AGC has been performed, may refrain from performing AGC in the second slot completely and continue to use the gain for the remainder of the second slot, or may perform AGC but determine that no adjustment is to be performed and thus continue to use the gain for the remainder of the second slot. The UE may use the gain if a proportion of a power associated with the transmission from the second UE in the first slot (e.g., a reference signal received power (RSRP)) to the total received signal power of the first slot is greater than a threshold value. If the proportion is less than the threshold value, the UE may use the default gain in the second slot. In other cases, the UE may use the first gain to calculate the second gain while accounting for other changes or variations in the radio environment of the UE. For example, while determining or calculating the second gain based on the first gain, the UE may account for the ending or continuing of a scheduled transmission from a third device.

In some cases, a spatial configuration associated with receiving the transmission in the first slot (e.g., a beam, such as a transmit beam used by a transmitting device, a receive beam used by the UE, or both) may be different from a spatial configuration (e.g., another beam) associated with receiving the transmission in the second slot. In such cases, the UE may determine the gain at the beginning of the second slot based on the gain in the first slot after performing AGC, the spatial configuration in the first slot, and the spatial configuration in the second slot. In some such cases, the UE may determine the gain at the beginning of the second slot based on a difference in gain associated with the spatial configuration in the first slot versus the spatial configuration in the second slot.

Adjusting the initial gain of a slot according to a temporal or spatial correlation may decrease the likelihood, on average, that the first symbol of a transmission in a slot is lost due to saturation or due to insufficient initial gain. As such, performing the methods as described herein may increase a number of symbols per slot, on average, that a UE may successfully decode.

Aspects of the disclosure are initially described in the context of a wireless communications system. Additional aspects of the disclosure are described in the context of an additional wireless communications system, a slot aggregation gain scheme, a resource reservation gain scheme, and a process flow. Aspects of the disclosure are further illustrated by and described with reference to apparatus diagrams, system diagrams, and flowcharts that relate to adaptive gain control for sidelink communications.

FIG. 1 illustrates an example of a wireless communications system 100 that supports adaptive gain control for sidelink communications in accordance with aspects of the present disclosure. The wireless communications system 100 includes base stations 105, UEs 115, and a core network 130. In some examples, the wireless communications system 100 may be a Long Term Evolution (LTE) network, an LTE-Advanced (LTE-A) network, an LTE-A Pro network, or a New Radio (NR) network. In some cases, wireless communications system 100 may support enhanced broadband communications, ultra-reliable (e.g., mission critical) communications, low latency communications, or communications with low-cost and low-complexity devices.

Base stations 105 may wirelessly communicate with UEs 115 via one or more base station antennas. Base stations 105 described herein may include or may be referred to by those skilled in the art as a base transceiver station, a radio base station, an access point, a radio transceiver, a NodeB, an eNodeB (eNB), a next-generation NodeB or giga-NodeB (either of which may be referred to as a gNB), a Home NodeB, a Home eNodeB, or some other suitable terminology. Wireless communications system 100 may include base stations 105 of different types (e.g., macro or small cell base stations). The UEs 115 described herein may be able to communicate with various types of base stations 105 and network equipment including macro eNBs, small cell eNBs, gNBs, relay base stations, and the like.

Each base station 105 may be associated with a particular geographic coverage area 110 in which communications with various UEs 115 is supported. Each base station 105 may provide communication coverage for a respective geographic coverage area 110 via communication links 125, and communication links 125 between a base station 105 and a UE 115 may utilize one or more carriers. Communication links 125 shown in wireless communications system 100 may include uplink transmissions from a UE 115 to a base station 105, or downlink transmissions from a base station 105 to a UE 115. Downlink transmissions may also be called forward link transmissions while uplink transmissions may also be called reverse link transmissions.

The geographic coverage area 110 for a base station 105 may be divided into sectors making up a portion of the geographic coverage area 110, and each sector may be associated with a cell. For example, each base station 105 may provide communication coverage for a macro cell, a small cell, a hot spot, or other types of cells, or various combinations thereof. In some examples, a base station 105 may be movable and therefore provide communication coverage for a moving geographic coverage area 110. In some examples, different geographic coverage areas 110 associated with different technologies may overlap, and overlapping geographic coverage areas 110 associated with different technologies may be supported by the same base station 105 or by different base stations 105. The wireless communications system 100 may include, for example, a heterogeneous LTE/LTE-A/LTE-A Pro or NR network in which different types of base stations 105 provide coverage for various geographic coverage areas 110.

The term "cell" refers to a logical communication entity used for communication with a base station 105 (e.g., over a carrier), and may be associated with an identifier for distinguishing neighboring cells (e.g., a physical cell identifier (PCID), a virtual cell identifier (VCID)) operating via the same or a different carrier. In some examples, a carrier may support multiple cells, and different cells may be configured according to different protocol types (e.g., machine-type communication (MTC), narrowband Internet-of-Things (NB-IoT), enhanced mobile broadband (eMBB), or others) that may provide access for different types of devices. In some cases, the term "cell" may refer to a portion of a geographic coverage area 110 (e.g., a sector) over which the logical entity operates.

UEs 115 may be dispersed throughout the wireless communications system 100, and each UE 115 may be stationary or mobile. A UE 115 may also be referred to as a mobile device, a wireless device, a remote device, a handheld device, or a subscriber device, or some other suitable terminology, where the "device" may also be referred to as a unit, a station, a terminal, or a client. A UE 115 may also be a personal electronic device such as a cellular phone, a personal digital assistant (PDA), a tablet computer, a laptop computer, or a personal computer. In some examples, a UE 115 may also refer to a wireless local loop (WLL) station, an Internet of Things (IoT) device, an Internet of Everything (IoE) device, or an MTC device, or the like, which may be implemented in various articles such as appliances, vehicles, meters, or the like.

Some UEs 115, such as MTC or IoT devices, may be low cost or low complexity devices, and may provide for automated communication between machines (e.g., via Machine-to-Machine (M2M) communication). M2M communication or MTC may refer to data communication technologies that allow devices to communicate with one another or a base station 105 without human intervention. In some examples, M2M communication or MTC may include communications from devices that integrate sensors or meters to measure or capture information and relay that information to a central server or application program that can make use of the information or present the information to humans interacting with the program or application. Some UEs 115 may be designed to collect information or enable automated behavior of machines. Examples of applications for MTC devices include smart metering, inventory monitoring, water level monitoring, equipment monitoring, healthcare monitoring, wildlife monitoring, weather and geological event monitoring, fleet management and tracking, remote security sensing, physical access control, and transaction-based business charging.

Some UEs 115 may be configured to employ operating modes that reduce power consumption, such as half-duplex communications (e.g., a mode that supports one-way communication via transmission or reception, but not transmission and reception simultaneously). In some examples half-duplex communications may be performed at a reduced peak rate. Other power conservation techniques for UEs 115 include entering a power saving "deep sleep" mode when not engaging in active communications, or operating over a limited bandwidth (e.g., according to narrowband communications). In some cases, UEs 115 may be designed to support critical functions (e.g., mission critical functions), and a wireless communications system 100 may be configured to provide ultra-reliable communications for these functions.

In some cases, a UE 115 may also be able to communicate directly with other UEs 115 (e.g., using a peer-to-peer (P2P) or device-to-device (D2D) protocol). One or more of a group of UEs 115 utilizing D2D communications may be within the geographic coverage area 110 of a base station 105. Other UEs 115 in such a group may be outside the geographic coverage area 110 of a base station 105, or be otherwise unable to receive transmissions from a base station 105. In some cases, groups of UEs 115 communicating via D2D communications may utilize a one-to-many (1:M) system in which each UE 115 transmits to every other UE 115 in the group. In some cases, a base station 105 facilitates the scheduling of resources for D2D communications. In other cases, D2D communications are carried out between UEs 115 without the involvement of a base station 105.

Base stations 105 may communicate with the core network 130 and with one another. For example, base stations 105 may interface with the core network 130 through backhaul links 132 (e.g., via an S1, N2, N3, or other interface). Base stations 105 may communicate with one another over backhaul links 134 (e.g., via an X2, Xn, or other interface) either directly (e.g., directly between base stations 105) or indirectly (e.g., via core network 130).

The core network 130 may provide user authentication, access authorization, tracking, Internet Protocol (IP) connectivity, and other access, routing, or mobility functions. The core network 130 may be an evolved packet core (EPC), which may include at least one mobility management entity (MME), at least one serving gateway (S-GW), and at least one Packet Data Network (PDN) gateway (P-GW). The MME may manage non-access stratum (e.g., control plane) functions such as mobility, authentication, and bearer management for UEs 115 served by base stations 105 associated with the EPC. User IP packets may be transferred through the S-GW, which itself may be connected to the P-GW. The P-GW may provide IP address allocation as well as other functions. The P-GW may be connected to the network operators IP services. The operators IP services may include access to the Internet, Intranet(s), an IP Multimedia Subsystem (IMS), or a Packet-Switched (PS) Streaming Service.

At least some of the network devices, such as a base station 105, may include subcomponents such as an access network entity, which may be an example of an access node controller (ANC). Each access network entity may communicate with UEs 115 through a number of other access network transmission entities, which may be referred to as a radio head, a smart radio head, or a transmission/reception point (TRP). In some configurations, various functions of each access network entity or base station 105 may be distributed across various network devices (e.g., radio heads and access network controllers) or consolidated into a single network device (e.g., a base station 105).

Wireless communications system 100 may operate using one or more frequency bands, typically in the range of 300 megahertz (MHz) to 300 gigahertz (GHz). Generally, the region from 300 MHz to 3 GHz is known as the ultra-high frequency (UHF) region or decimeter band, since the wavelengths range from approximately one decimeter to one meter in length. UHF waves may be blocked or redirected by buildings and environmental features. However, the waves may penetrate structures sufficiently for a macro cell to provide service to UEs 115 located indoors. Transmission of UHF waves may be associated with smaller antennas and shorter range (e.g., less than 100 km) compared to transmission using the smaller frequencies and longer waves of the high frequency (HF) or very high frequency (VHF) portion of the spectrum below 300 MHz.

Wireless communications system 100 may also operate in a super high frequency (SHF) region using frequency bands from 3 GHz to 30 GHz, also known as the centimeter band. The SHF region includes bands such as the 5 GHz industrial, scientific, and medical (ISM) bands, which may be used opportunistically by devices that may be capable of tolerating interference from other users.

Wireless communications system 100 may also operate in an extremely high frequency (EHF) region of the spectrum (e.g., from 30 GHz to 300 GHz), also known as the millimeter band. In some examples, wireless communications system 100 may support millimeter wave (mmW) communications between UEs 115 and base stations 105, and EHF antennas of the respective devices may be even smaller and more closely spaced than UHF antennas. In some cases, this may facilitate use of antenna arrays within a UE 115. However, the propagation of EHF transmissions may be subject to even greater atmospheric attenuation and shorter range than SHF or UHF transmissions. Techniques disclosed herein may be employed across transmissions that use one or more different frequency regions, and designated use of bands across these frequency regions may differ by country or regulating body.

In some cases, wireless communications system 100 may utilize both licensed and unlicensed radio frequency spectrum bands. For example, wireless communications system 100 may employ License Assisted Access (LAA), LTE-Unlicensed (LTE-U) radio access technology, or NR technology in an unlicensed band such as the 5 GHz ISM band. When operating in unlicensed radio frequency spectrum bands, wireless devices such as base stations 105 and UEs 115 may employ listen-before-talk (LBT) procedures to ensure a frequency channel is clear before transmitting data. In some cases, operations in unlicensed bands may be based on a carrier aggregation configuration in conjunction with component carriers operating in a licensed band (e.g., LAA). Operations in unlicensed spectrum may include downlink transmissions, uplink transmissions, peer-to-peer transmissions, or a combination of these. Duplexing in unlicensed spectrum may be based on frequency division duplexing (FDD), time division duplexing (TDD), or a combination of both.

In some examples, base station 105 or UE 115 may be equipped with multiple antennas, which may be used to employ techniques such as transmit diversity, receive diversity, multiple-input multiple-output (MIMO) communications, or beamforming. For example, wireless communications system 100 may use a transmission scheme between a transmitting device (e.g., a base station 105) and a receiving device (e.g., a UE 115), where the transmitting device is equipped with multiple antennas and the receiving device is equipped with one or more antennas. MIMO communications may employ multipath signal propagation to increase the spectral efficiency by transmitting or receiving multiple signals via different spatial layers, which may be referred to as spatial multiplexing. The multiple signals may, for example, be transmitted by the transmitting device via different antennas or different combinations of antennas. Likewise, the multiple signals may be received by the receiving device via different antennas or different combinations of antennas. Each of the multiple signals may be referred to as a separate spatial stream, and may carry bits associated with the same data stream (e.g., the same codeword) or different data streams. Different spatial layers may be associated with different antenna ports used for channel measurement and reporting. MIMO techniques include single-user MIMO (SU-MIMO) where multiple spatial layers are transmitted to the same receiving device, and multiple-user MIMO (MU-MIMO) where multiple spatial layers are transmitted to multiple devices.

Beamforming, which may also be referred to as spatial filtering, directional transmission, or directional reception, is a signal processing technique that may be used at a transmitting device or a receiving device (e.g., a base station 105 or a UE 115) to shape or steer an antenna beam (e.g., a transmit beam or receive beam) along a spatial path between the transmitting device and the receiving device. Beamforming may be achieved by combining the signals communicated via antenna elements of an antenna array such that signals propagating at particular orientations with respect to an antenna array experience constructive interference while others experience destructive interference. The adjustment of signals communicated via the antenna elements may include a transmitting device or a receiving device applying certain amplitude and phase offsets to signals carried via each of the antenna elements associated with the device. The adjustments associated with each of the antenna elements may be defined by a beamforming weight set associated with a particular orientation (e.g., with respect to the antenna array of the transmitting device or receiving device, or with respect to some other orientation).

In one example, a base station 105 may use multiple antennas or antenna arrays to conduct beamforming operations for directional communications with a UE 115. For instance, some signals (e.g. synchronization signals, reference signals, beam selection signals, or other control signals) may be transmitted by a base station 105 multiple times in different directions, which may include a signal being transmitted according to different beamforming weight sets associated with different directions of transmission. Transmissions in different beam directions may be used to identify (e.g., by the base station 105 or a receiving device, such as a UE 115) a beam direction for subsequent transmission and/or reception by the base station 105.

Some signals, such as data signals associated with a particular receiving device, may be transmitted by a base station 105 in a single beam direction (e.g., a direction associated with the receiving device, such as a UE 115). In some examples, the beam direction associated with transmissions along a single beam direction may be determined based at least in in part on a signal that was transmitted in different beam directions. For example, a UE 115 may receive one or more of the signals transmitted by the base station 105 in different directions, and the UE 115 may report to the base station 105 an indication of the signal it received with a highest signal quality, or an otherwise acceptable signal quality. Although these techniques are described with reference to signals transmitted in one or more directions by a base station 105, a UE 115 may employ similar techniques for transmitting signals multiple times in different directions (e.g., for identifying a beam direction for subsequent transmission or reception by the UE 115), or transmitting a signal in a single direction (e.g., for transmitting data to a receiving device).

A receiving device (e.g., a UE 115, which may be an example of a mmW receiving device) may try multiple receive beams when receiving various signals from the base station 105, such as synchronization signals, reference signals, beam selection signals, or other control signals. For example, a receiving device may try multiple receive directions by receiving via different antenna subarrays, by processing received signals according to different antenna subarrays, by receiving according to different receive beamforming weight sets applied to signals received at a plurality of antenna elements of an antenna array, or by processing received signals according to different receive beamforming weight sets applied to signals received at a plurality of antenna elements of an antenna array, any of which may be referred to as "listening" according to different receive beams or receive directions. In some examples a receiving device may use a single receive beam to receive along a single beam direction (e.g., when receiving a data signal). The single receive beam may be aligned in a beam direction determined based on listening according to different receive beam directions (e.g., a beam direction determined to have a highest signal strength, highest signal-to-noise ratio, or otherwise acceptable signal quality based on listening according to multiple beam directions).

In some cases, the antennas of a base station 105 or UE 115 may be located within one or more antenna arrays, which may support MIMO operations, or transmit or receive beamforming. For example, one or more base station antennas or antenna arrays may be co-located at an antenna assembly, such as an antenna tower. In some cases, antennas or antenna arrays associated with a base station 105 may be located in diverse geographic locations. A base station 105 may have an antenna array with a number of rows and columns of antenna ports that the base station 105 may use to support beamforming of communications with a UE 115. Likewise, a UE 115 may have one or more antenna arrays that may support various MIMO or beamforming operations.

In some cases, wireless communications system 100 may be a packet-based network that operate according to a layered protocol stack. In the user plane, communications at the bearer or Packet Data Convergence Protocol (PDCP) layer may be IP-based. A Radio Link Control (RLC) layer may perform packet segmentation and reassembly to communicate over logical channels. A Medium Access Control (MAC) layer may perform priority handling and multiplexing of logical channels into transport channels. The MAC layer may also use hybrid automatic repeat request (HARQ) to provide retransmission at the MAC layer to improve link efficiency. In the control plane, the Radio Resource Control (RRC) protocol layer may provide establishment, configuration, and maintenance of an RRC connection between a UE 115 and a base station 105 or core network 130 supporting radio bearers for user plane data. At the Physical layer, transport channels may be mapped to physical channels.

In some cases, UEs 115 and base stations 105 may support retransmissions of data to increase the likelihood that data is received successfully. HARQ feedback is one technique of increasing the likelihood that data is received correctly over a communication link 125. HARQ may include a combination of error detection (e.g., using a cyclic redundancy check (CRC)), forward error correction (FEC), and retransmission (e.g., automatic repeat request (ARQ)). HARQ may improve throughput at the MAC layer in poor radio conditions (e.g., signal-to-noise conditions). In some cases, a wireless device may support same-slot HARQ feedback, where the device may provide HARQ feedback in a specific slot for data received in a previous symbol in the slot. In other cases, the device may provide HARQ feedback in a subsequent slot, or according to some other time interval.

Time intervals in LTE or NR may be expressed in multiples of a basic time unit, which may, for example, refer to a sampling period of $T_s=1/30,720,000$ seconds. Time intervals of a communications resource may be organized according to radio frames each having a duration of 10 milliseconds (ms), where the frame period may be expressed as $T_f=307,200$ $T_s$. The radio frames may be identified by a system frame number (SFN) ranging from 0 to 1023. Each frame may include 10 subframes numbered from 0 to 9, and each subframe may have a duration of 1 ms. A subframe may be further divided into 2 slots each having a duration of 0.5 ms, and each slot may contain 6 or 7 modulation symbol periods (e.g., depending on the length of the cyclic prefix prepended to each symbol period). Excluding the cyclic prefix, each symbol period may contain 2048 sampling periods. In some cases, a subframe may be the smallest scheduling unit of the wireless communications system 100, and may be referred to as a transmission time interval (TTI). In other cases, a smallest scheduling unit of the wireless communications system 100 may be shorter than a subframe or may be dynamically selected (e.g., in bursts of shortened TTIs (sTTIs) or in selected component carriers using sTTIs).

In some wireless communications systems, a slot may further be divided into multiple mini-slots containing one or more symbols. In some instances, a symbol of a mini-slot or a mini-slot may be the smallest unit of scheduling. Each symbol may vary in duration depending on the subcarrier spacing or frequency band of operation, for example. Further, some wireless communications systems may implement slot aggregation in which multiple slots or mini-slots are aggregated together and used for communication between a UE 115 and a base station 105.

The term "carrier" refers to a set of radio frequency spectrum resources having a defined physical layer structure for supporting communications over a communication link 125. For example, a carrier of a communication link 125 may include a portion of a radio frequency spectrum band that is operated according to physical layer channels for a given radio access technology. Each physical layer channel may carry user data, control information, or other signaling. A carrier may be associated with a pre-defined frequency channel (e.g., an evolved universal mobile telecommunication system terrestrial radio access (E-UTRA) absolute radio frequency channel number (EARFCN)), and may be positioned according to a channel raster for discovery by UEs 115. Carriers may be downlink or uplink (e.g., in an FDD mode), or be configured to carry downlink and uplink communications (e.g., in a TDD mode). In some examples, signal waveforms transmitted over a carrier may be made up of multiple sub-carriers (e.g., using multi-carrier modulation (MCM) techniques such as orthogonal frequency division multiplexing (OFDM) or discrete Fourier transform spread OFDM (DFT-S-OFDM)).

The organizational structure of the carriers may be different for different radio access technologies (e.g., LTE, LTE-A, LTE-A Pro, NR). For example, communications over a carrier may be organized according to TTIs or slots, each of which may include user data as well as control information or signaling to support decoding the user data. A carrier may also include dedicated acquisition signaling (e.g., synchronization signals or system information, etc.) and control signaling that coordinates operation for the carrier. In some examples (e.g., in a carrier aggregation configuration), a carrier may also have acquisition signaling or control signaling that coordinates operations for other carriers.

Physical channels may be multiplexed on a carrier according to various techniques. A physical control channel and a physical data channel may be multiplexed on a downlink carrier, for example, using time division multiplexing (TDM) techniques, frequency division multiplexing (FDM) techniques, or hybrid TDM-FDM techniques. In some examples, control information transmitted in a physical control channel may be distributed between different control regions in a cascaded manner (e.g., between a common control region or common search space and one or more UE-specific control regions or UE-specific search spaces).

A carrier may be associated with a particular bandwidth of the radio frequency spectrum, and in some examples the carrier bandwidth may be referred to as a "system bandwidth" of the carrier or the wireless communications system 100. For example, the carrier bandwidth may be one of a number of predetermined bandwidths for carriers of a particular radio access technology (e.g., 1.4, 3, 5, 10, 15, 20, 40, or 80 MHz). In some examples, each served UE 115 may be configured for operating over portions or all of the carrier bandwidth. In other examples, some UEs 115 may be configured for operation using a narrowband protocol type that is associated with a predefined portion or range (e.g., set of subcarriers or RBs) within a carrier (e.g., "in-band" deployment of a narrowband protocol type).

In a system employing MCM techniques, a resource element may consist of one symbol period (e.g., a duration of one modulation symbol) and one subcarrier, where the symbol period and subcarrier spacing are inversely related. The number of bits carried by each resource element may depend on the modulation scheme (e.g., the order of the modulation scheme). Thus, the more resource elements that a UE 115 receives and the higher the order of the modulation scheme, the higher the data rate may be for the UE 115. In MIMO systems, a wireless communications resource may refer to a combination of a radio frequency spectrum resource, a time resource, and a spatial resource (e.g., spatial layers), and the use of multiple spatial layers may further increase the data rate for communications with a UE 115.

Devices of the wireless communications system 100 (e.g., base stations 105 or UEs 115) may have a hardware configuration that supports communications over a particular carrier bandwidth, or may be configurable to support communications over one of a set of carrier bandwidths. In some examples, the wireless communications system 100 may include base stations 105 and/or UEs 115 that support simultaneous communications via carriers associated with more than one different carrier bandwidth.

Wireless communications system 100 may support communication with a UE 115 on multiple cells or carriers, a feature which may be referred to as carrier aggregation or multi-carrier operation. A UE 115 may be configured with multiple downlink component carriers and one or more uplink component carriers according to a carrier aggregation configuration. Carrier aggregation may be used with both FDD and TDD component carriers.

In some cases, wireless communications system 100 may utilize enhanced component carriers (eCCs). An eCC may be characterized by one or more features including wider carrier or frequency channel bandwidth, shorter symbol duration, shorter TTI duration, or modified control channel configuration. In some cases, an eCC may be associated with a carrier aggregation configuration or a dual connectivity configuration (e.g., when multiple serving cells have a suboptimal or non-ideal backhaul link). An eCC may also be configured for use in unlicensed spectrum or shared spectrum (e.g., where more than one operator is allowed to use the spectrum). An eCC characterized by wide carrier bandwidth may include one or more segments that may be utilized by UEs 115 that are not capable of monitoring the whole carrier bandwidth or are otherwise configured to use a limited carrier bandwidth (e.g., to conserve power).

In some cases, an eCC may utilize a different symbol duration than other component carriers, which may include use of a reduced symbol duration as compared with symbol durations of the other component carriers. A shorter symbol duration may be associated with increased spacing between adjacent subcarriers. A device, such as a UE 115 or base station 105, utilizing eCCs may transmit wideband signals (e.g., according to frequency channel or carrier bandwidths of 20, 40, 60, 80 MHz, etc.) at reduced symbol durations (e.g., 16.67 microseconds). A TTI in eCC may consist of one or multiple symbol periods. In some cases, the TTI duration (that is, the number of symbol periods in a TTI) may be variable.

Wireless communications system 100 may be an NR system that may utilize any combination of licensed, shared, and unlicensed spectrum bands, among others. The flexibility of eCC symbol duration and subcarrier spacing may allow for the use of eCC across multiple spectrums. In some examples, NR shared spectrum may increase spectrum utilization and spectral efficiency, specifically through dynamic vertical (e.g., across the frequency domain) and horizontal (e.g., across the time domain) sharing of resources.

Generally, the described techniques provide for a first UE 115 to receive one or more transmissions from one or more UEs 115 in a first slot, including a first transmission from a second UE 115. The first UE 115 may receive the first transmission using a receiver configured with a first gain and may decode the first transmission. The UE 115 may determine a correspondence (e.g., a temporal correlation, a spatial correlation, or both) between the first slot and a second slot and may configure the receiver with a second gain at the beginning of the second slot based on based on the correspondence. As used herein, a correspondence between slots may refer to a correspondence between transmissions received or expected to be received during the slots. For instance, the UE 115 may determine that a total received signal power in the second slot is associated with the total received signal power in the first slot. The UE 115 may decode one or more transmissions in the second slot based on the receiver having the second gain at the beginning of the slot.

Figure 2:
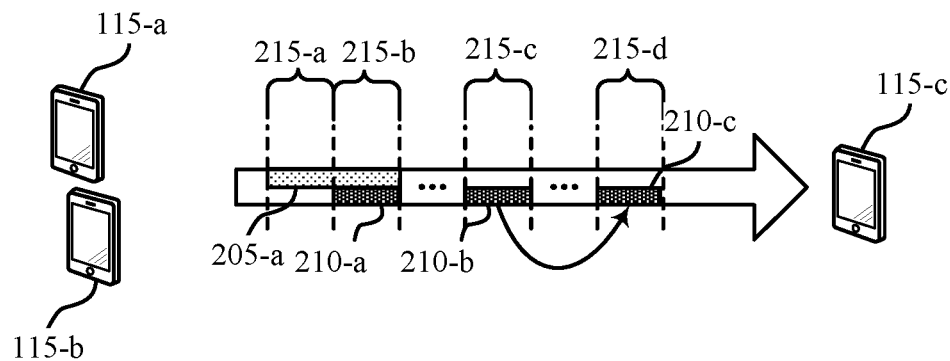
FIG. 2 illustrates an example of a wireless communications system that supports adaptive gain control for sidelink communications in accordance with aspects of the present disclosure.

FIG. 2 illustrates an example of a wireless communications system 200 that supports adaptive gain control for sidelink communications in accordance with aspects of the present disclosure. In some examples, wireless communications system 200 may implement aspects of wireless communications system 100. For instance, wireless communications system 200 may include UEs 115-a, 115-b, and 115-c, which may be examples of UEs 115 as described with reference to FIG. 1.

UE 115-a and UE 115-b may perform sidelink communications with UE 115-c. For instance, UE 115-a may transmit UE1 transmissions 205 to UE 115-c and UE 115-b may transmit UE2 transmissions 210 to UE 115-c. UE1 transmissions 205 and UE2 transmissions 210 may span one slot 215 or may span multiple slots 215 (e.g., using slot aggregation). For instance, UE1 transmission 205-a may span slots 215-a and 215-b, which may be consecutive slots 215. UE2 transmission 210-a may span slot 215-b, UE2 transmission 210-b may span slot 215-c, and UE2 transmission 210-c may span slot 215-d. Additionally, each UE1 transmission 205 or UE2 transmission 210 may contain a control region and a data region. UE2 transmission 210-c may be a retransmission of UE2 transmission 210-b.

In general, a total received signal power (e.g., an RSSI) may vary from slot 215 to slot 215. For instance, a total received signal power of slot 215-*a* may be different from a total received signal power of slot 215-*b* (e.g., slot 215-*a*, which may contain UE1 transmission 205-*a* alone may have a different total received signal power from slot 215-*b*, which may contain UE1 transmission 205-*a* and UE2 transmission 210-*a*). The total received signal power of a first slot 215 may be independent of a second slot 215 unless the two slots 215 have a temporal or spatial correlation. Two slots 215 may be temporally correlated if at least a portion of the total received signal power of a first slot 215 corresponds to (or is expected to correspond to) at least a portion of the total received signal power of a second slot 215.

One example of a transmission with a temporally correlated first slot 215 and second slot 215 may be a slot-aggregated transmission (e.g., UE1 transmission 205-*a*). A slot-aggregated transmission may span multiple consecutive slots 215 and may have a total received signal power in each slot 215 correlated with the total received signal powers in the other slots 215. For instance, at least a portion of the total received signal powers for both slots 215-*a* and 215-*b* may be due to UE1 transmission 205-*a*. A power of UE1 transmission 205-*a* over slot 215-*a* may correspond to (e.g., be approximately the same as) a power of UE1 transmission 205-*a* over slot 215-*b*. As such, slots 215-*a* and 215-*b* may be temporally correlated.

Another example of a transmission with a temporally correlated first slot 215 and second slot 215 may be a transmission including a resource reservation (e.g., UE2 transmission 210-*b*, which may have a reserved resource for UE2 transmission 210-*c*). The transmission indicating the resource reservation may be in a slot n and the reserved resource may span a slot m. Slot n and slot m may be consecutive or non-consecutive slots (e.g., slot m may not be a slot 215 immediately subsequent to slot n). The reserved resource may be used if the transmission is to be retransmitted (e.g., UE2 transmission 210-*c* may be a retransmitted UE2 transmission 210-*b*), such as if UE 115-*c* does not correctly decode all of UE2 transmission 210-*b*. The slot including the transmission indicating the resource reservation may have a total received signal power that corresponds to a total received signal power of the slot 215 which the indicated reserved resource may span. For instance, at least a portion of the total received signal powers for slots 215-*c* and 215-*d* may be due to UE2 transmissions 210-*b* and 210-*c*. UE2 transmission 210-*c* may be a retransmission of UE2 transmission 210-*b* and, thus, a received power of UE2 transmission 210-*b* may correspond to (e.g., be approximately the same as) a received power of UE2 transmission 210-*c*. In some cases, the reserved resource may be used for a completely different transmission (e.g., UE2 transmission 210-*c* may not be a retransmitted UE2 transmission 210-*b*).

At the beginning of a slot 215, UE 115-*c* may perform AGC retraining or setting. AGC retraining may be performed at the beginning of each slot 215, as it may be assumed that total received signal power may vary from slot 215 to slot 215, or may be performed for a subset of slots 215 (e.g., may only be performed for a first slot 215 of a set of temporally correlated slots 215). AGC may determine an optimal front end gain to use to receive transmissions in a slot 215 where AGC retraining is being performed based on a total received signal power at the beginning of the slot 215. AGC retraining may use a wideband RSSI measurement (e.g., $I^2+Q^2$) based on initial samples of a slot 215 to determine a total received signal power of the slot 215. A gain setting may be chosen that yields a best signal-to-quantization-noise ratio (SQNR). In general, AGC retraining may occur over a AGC setting time which may include an RSSI measurement, determining a gain setting, and programming the front end. The AGC setting time may be a time for an LNA gain state (e.g., the LNA whose gain is being programmed) to settle. In some cases, the AGC setting time may be approximately 34 microseconds (μs), which may be one symbol at 30 kilohertz (kHz).

UE 115-*c* may receive one or more communications from UE 115-*a* and/or 115-*b* (e.g., UE1 transmissions 205 and/or UE2 transmissions 210) in a first slot 215. UE 115-*c* may begin the first slot with an initial receiver gain (e.g., a default receiver gain) and may perform AGC retraining during one or more beginning symbols (e.g., a first symbol) of the first slot 215. Upon performing AGC retraining, UE 115-*c* may determine an updated receiver gain with which to receive a remaining portion of the one or more communications in the other symbols of the first slot 215. If the first slot 215 is temporally correlated with a second slot 215, UE 115-*c* may use a receiver gain at the beginning of the second slot 215 that is different from the initial receiver gain to receive one or more communications from UE 115-*a* and/or UE 115-*b*. The receiver gain used at the beginning of the second slot 215 may be associated with the updated receiver gain of the first slot 215. For instance, the receiver gain at the beginning of the second slot 215 may be equal to the updated receiver gain of the first slot 215 or may be otherwise based on the updated receiver gain of the first slot 215.

In some cases, UE 115-*c* may receive an indication of the temporally correlated second slot 215 based on the one or more communications from UE 115-*a* and/or 115-*b* in the first slot 215. The indication may indicate that the UE 115 providing the indication in the first slot 215 may transmit a communication in the second slot 215. For instance, UE 115-*c* may decode a communication from UE 115-*a* (e.g., a UE1 transmission 205) in the first slot 215 that indicates a second slot 215 in which UE 115-*a* may transmit. In some cases, the indication of the second slot 215 may be included in a control region of the communication (e.g., the communication may include a control transmission). If the second slot 215 is an immediately subsequent slot 215 after the first slot 215 (e.g., in a slot-aggregated transmission, such as UE1 transmission 205-*a*), the indication may be or may be based on a number of slots (e.g., consecutive slots) that UE 115-*a* intends to transmit over. For instance, UE1 transmission 205-*a* may include an indication that UE 115-*a* is to transmit a UE1 transmission 205-*a* over two slots 215 (e.g., slots 215-*a* and 215-*b*). If the second slot 215 is not an immediately subsequent slot 215 after the first slot 215 (e.g., in a resource reservation transmission, such as UE2 transmission 210-*b*), the indication of the second slot 215 may be included as a reserved resource in the second slot 215.

In some cases, the receiver gain at the beginning of the second slot 215 may be based on a total received signal power in the first slot 215, an RSRP level of the UE 115 providing the indication of the second slot 215, a spatial configuration (e.g., a beam) used for reception by UE 115-*c* in the first slot 215 (or transmission by another UE 115 in the first slot 215, which may be assigned to UE 115-*c*), a spatial configuration used for reception by UE 115-*c* in the second slot 215 (or transmission by another UE 115 in the second slot 215, which may be assigned to UE 115-*c*), or any combination thereof. For instance, UE 115-*c* may determine what fraction of the total received signal power in the first slot 215 is due to the UE 115 in the first slot 215 providing the indication of the second slot 215 and may determine the receiver gain of at the beginning of the second slot 215 based on the fraction. This fraction of the received power may be the expected received power in the second slot 215. In one example, the fraction may be $$\frac{RSRP_{UE}}{RSSI},$$

where $RSRP_{UE}$ may correspond to an RSRP level associated with the UE 115 providing the indication of the second slot 215 and RSSI may be a total received signal power (e.g., an RSSI) observed (e.g., detected) by UE 115-*c* in the first slot 215. If the fraction is above a threshold value, UE 115-*c* may assume that the total received signal power in the first slot 215 is dominated by the communication that the UE 115 providing the indication of the second slot 215 is providing. Additionally, UE 115-*c* may assume that the expected power for the second slot 215 is approximately RSSI. As such, the receiver gain used in the first slot 215 after performing AGC may be reused at the beginning of the second slot 215. If the fraction is below the threshold value, the receiver gain used at the beginning of the second slot 215 may be set to the initial default gain used at the beginning of the first slot 215.

In some cases, the spatial configuration used for reception in the first slot 215 by UE 115-*c* (or transmission by another UE 115) may be different from the spatial configuration used for reception in the second slot 215 by UE 115-*c* (or transmission by another UE 115). In such cases, the receiver gain used at the beginning of the second slot 215 may account for gain or loss (e.g., the receiver gain used at the beginning of the second slot 215 may not be exactly equal to the receiver gain of the first slot 215 after performing AGC, but may be adjusted to account for the gain or loss by the spatial configuration difference). In some cases, the UE 115 providing the indication of the second slot 215 may provide an indication of whether the spatial configuration in the first slot 215 is the same as or different from the spatial configuration used for transmission in the second slot 215.

In some cases, the transmission in the second slot 215 may be subject to feedback from one or more receivers for which the communication from the one or more UEs 115 was intended (e.g., if a UE 115 transmits a resource reservation transmission for a potential retransmission of a packet, the retransmission may be performed if a negative acknowledgement (NACK) is sent by the receivers). In one example, UE 115-*b* may transmit UE2 transmission 210-*b* to UE 115-*c*. UE 115-*c* may receive UE2 transmission 210-*b* but may not correctly decode UE2 transmission 210-*b*. UE 115-*c* may transmit a NACK to UE 115-*b*, which may resend the contents of UE2 transmission 210-*b* to UE 115-*c* as UE2 transmission 210-*c*. UE 115-*c* may use the updated receiver gain of slot 215-*c* at the beginning of slot 215-*d*. In another example, UE 115-*b* may transmit UE2 transmission 210-*b* to UE 115-*c*. UE 115-*c* may receive UE2 transmission 210-*b* and may successfully decode UE2 transmission 210-*b*. In such cases, UE 115-*c* may transmit an acknowledgement (ACK) to UE 115-*b*. Upon receiving the ACK, UE 115-*b* may not transmit UE2 transmission 210-*c*. In such cases, UE 115-*b* may not adjust the gain in slot 215-*d* based on UE2 transmission 210-*b* (e.g., the default gain of the slot 215-*c* may be used at the start of slot 215-*d*).

In some cases, a UE 115 performing an AGC operation (e.g., UE 115-*c*) may not be a receiver for which the one or more communications from UE 115-*a* and/or UE 115-*b* is intended. Such a UE 115 may still decode and look at the control information from the communication, but may determine that the data is not for the UE 115 and may not decode the data. Such a UE 115 may perform the operation of control decoding, RSRP measurement, and AGC functionality for all received transmission for the purpose of receive gain prediction of the second slot 215.

In some cases, UE 115-*c* may provide power control feedback for transmission by the UE 115 providing the indication of the second slot 215. The power control feedback may enable the UE 115 providing the indication to determine the receiver gain for the second slot 215. The UE 115 providing the indication may change a transmission power of a transmission in the second slot 215 based on the power control feedback (which may be transmit power control (TPC)).

UE 115-*c* may set the receiver to a default gain state in a number of scenarios (e.g., the initial receiver gain of the first slot may be a default receiver gain). In one example, the default gain state may be fixed (e.g., each time UE 115-*c* sets the receiver to the default gain state the default receiver gain is the same) or may be changed over time. For instance, UE 115-*c* may observe parameters (e.g., statistics) of the updated receiver gain in each slot 215 (e.g., the receiver gain after performing AGC) used for decoding. UE 115-*c* may adapt the default receiver gain value over time according to the statistics. For instance, UE 115-*c* may use long-term filtering of the statistics, which may more accurately represent the environment. In one example, a set of clustered UEs 115 may be close to UE 115-*c*. As such, the probability of a higher total received signal power may be higher than if some or each of the set of clustered UEs 115 were farther away. As such, a lower gain setting may be used as the default gain state. Alternatively (e.g., if there are UEs 115 more spread out from UE 115-*c*, such as in a highway setting), the probability of getting a high total received signal power may be lower than if the UEs 115 were closer to UE 115-*c*. As such, a higher gain setting may be used as the default gain state.

Exploiting the temporal or spatial correlation to determine the starting gain in the slot may yield better performance assuming independent receiver power than not exploiting the temporal or spatial correlation. For instance, it may be expected that the probability of losing the one or more beginning symbols (e.g., one symbol for 15/30 kHz subcarrier spacing (SCS), two symbols for 60 kHz SCS) may be reduced, as the receiver gain based on a previous slot may be closer to an ideal gain for the slot than the default gain may be.

Figure 3:
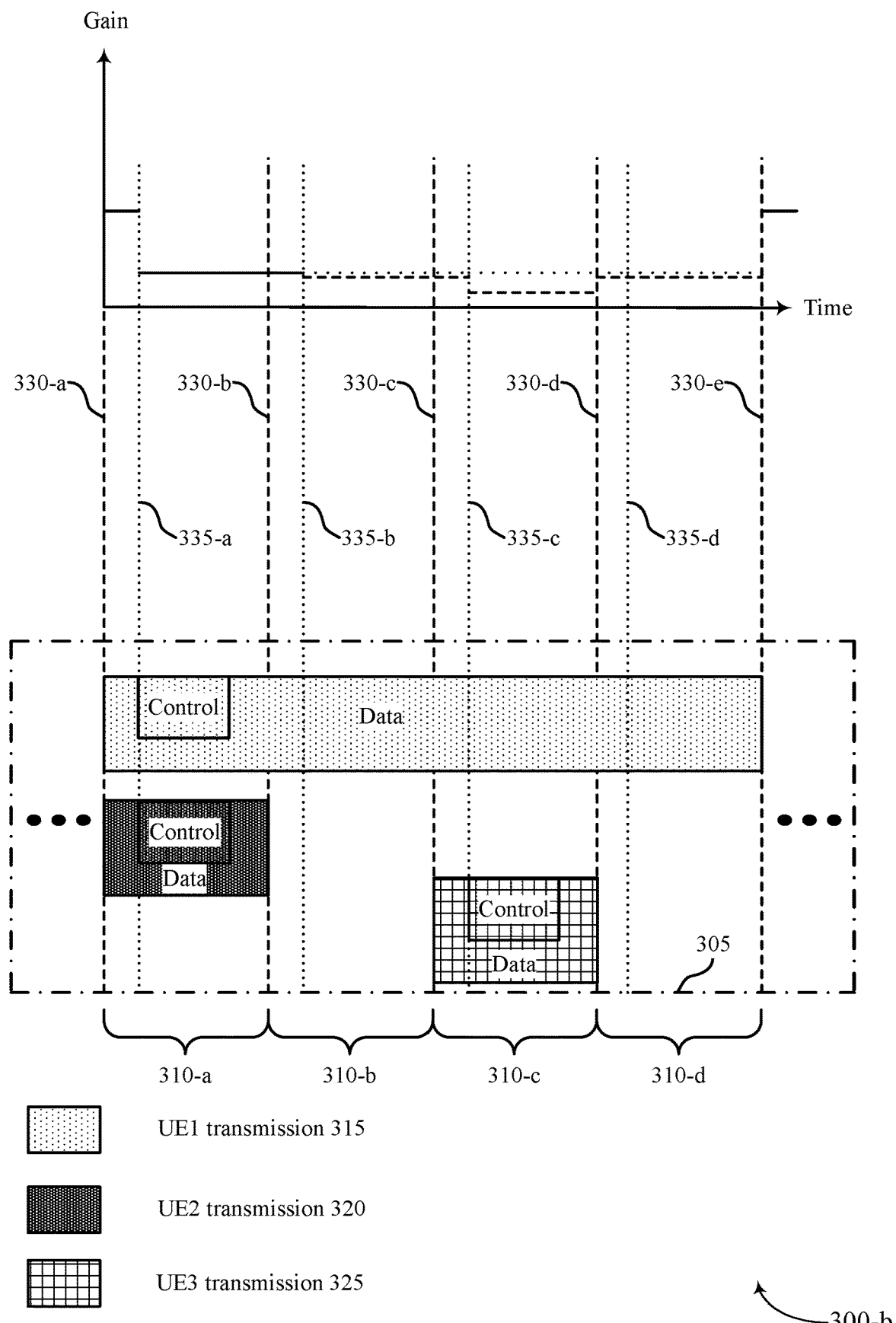
FIG. 3 illustrates an example of a slot aggregation gain scheme that supports adaptive gain control for sidelink communications in accordance with aspects of the present disclosure.

FIG. 3 illustrates an example of a slot aggregation gain scheme 300 that supports adaptive gain control for sidelink communications in accordance with aspects of the present disclosure. In some examples, slot aggregation gain scheme 300 may be implemented by aspects of wireless communications system 100. For instance, UE1 transmission 315 may be sent from a first UE 115, UE2 transmission 320 may be sent by a second UE 115, and UE3 transmission 325 may be sent by a third UE 115. Slot aggregation gain scheme 300 may include sidelink communication grid 305 composed of a number of slots 310. Each UE transmission may span one or more slots 310. For instance, UE1 transmission 315 may span multiple slots 310 (e.g., 4 slots 310) while UE2 transmission 320 and UE3 transmission 325 may each span a single slot 310. Each UE transmission may have a control region and a data region. UE1 transmission 315 may be a UE transmission utilizing slot aggregation. As such, the control region for UE1 transmission 315 may be located in a first slot 310 of the UE1 transmission 315, and the remaining slots 310 may include data.

At 330-*a*, UE1 transmission 315 and UE2 transmission 320 may arrive at a receiving UE 115. In between 330-*a* and 335-*a*, a receiver of the receiving UE 115 may receive UE1 transmission 315 and UE2 transmission 320 at a default initial gain. Additionally, in between 330-*a* and 335-*a*, the receiving UE 115 may perform AGC to determine a gain to be used in slot 310-*a*. This gain may be based on energy from the UE1 transmission 315 and UE2 transmission 320. The time spanning 330-*a* and 335-*a* may represent an AGC setting time and may span one or more beginning symbols (e.g., a first symbol) of slot 310-*a*. At 335-*a*, the gain may switch to an updated gain value and the remaining symbols of slot 310-*a* may be received using the updated gain value.

The control region of UE1 transmission 315 may indicate a number of slots for which the UE1 transmission 315 is to be transmitted (e.g., 4 slots). After receiving the indication, the receiving UE 115 may determine a fraction of the RSRP of the UE1 transmission 315 in slot 310-*a* to a total signal received power (e.g., an RSSI) of slot 310-*a* and may determine if the fraction is greater than a threshold (e.g., may determine if UE1 transmission 315 dominates the total signal received power). If the fraction is greater than the threshold, the receiving UE 115 may use the updated gain value between 330-*b* and 335-*b* to receive UE transmissions of slot 310-*b*. If the fraction is less than the threshold, the UE 115 may not assign a new gain in between 330-*b* and 335-*b* based on UE1 transmission 315 (e.g., the UE 115 may return to using the default initial gain that was used between 330-*a* and 335-*a*).

At 330-*b* and assuming the fraction is greater than the threshold, the receiving UE 115 may use the updated gain value of slot 310-*a* as the initial gain value of slot 310-*b*. If the receiving UE 115 performs AGC, the initial gain value of slot 310-*b* may be used to receive one or more beginning symbols (e.g., a first symbol) and may be changed after AGC is performed (e.g., at 335-*b*) to an updated gain value for slot 310-*b*. The updated gain value may be used to receive the remaining symbols of UE1 transmission 315 in slot 310-*b*. Alternatively, the receiving UE 115 may perform AGC but may determine that no adjustment is to be performed and may, thus, continue to use the initial gain value of slot 310-*b* for the remainder of slot 310-*b*. If the receiving UE 115 does not perform AGC in slot 310-*b*, the initial gain value may be used to receive all symbols of UE1 transmission 315 in slot 310-*b*.

At 330-*c*, the receiving UE 115 may use the initial gain value of slot 310-*b* (e.g., if AGC was not performed in slot 310-*b*) as an initial gain value of slot 310-*c* or may use the updated gain value of slot 310-*b* (e.g., if AGC was performed in slot 310-*b*) as an initial gain value of slot 310-*c*. In some cases, the receiving UE 115 may use the initial gain value of slot 310-*b* or the updated gain value of slot 310-*a* as the initial gain value of 310-*c* regardless of if AGC was performed or not in slot 310-*b*. If the receiving UE 115 performs AGC, the initial gain value of slot 310-*c* may be used to receive one or more beginning symbols (e.g., a first symbol) of UE1 transmission 315 and UE3 transmission 325 and may be changed after AGC is performed (e.g., at 335-*c*) to an updated gain value for slot 310-*c*. The updated gain value may be used to receive the remaining symbols of UE1 transmission 315 and UE3 transmission 325 in slot 310-*c*. Alternatively, the receiving UE 115 may perform AGC but may determine that no adjustment is to be performed and may, thus, continue to use the initial gain value of slot 310-*c* for the remainder of the slot 310-*c*. If the receiving UE 115 does not perform AGC in slot 310-*c*, the initial gain value may be used to receive all symbols of UE1 transmission 310 and UE3 transmission 325 in slot 310-*c*.

At 330-*d*, the receiving UE 115 may use the initial gain value of slot 310-*c* (e.g., if AGC was not performed in slot 310-*c*) as an initial gain value of slot 310-*d* or may use the updated gain value of slot 310-*c* (e.g., if AGC was performed in slot 310-*c*) as an initial gain value of slot 310-*d*. In some cases, the receiving UE 115 may use the initial gain value of slot 310-*c* or the updated gain value of slot 310-*a* as the initial gain value of 310-*d* regardless of if AGC was performed or not in slot 310-*c*. If the receiving UE 115 performs AGC, the initial gain value of slot 310-*d* may be used to receive one or more beginning symbols (e.g., a first symbol) of UE1 transmission 315 and may be changed after AGC is performed (e.g., at 335-*d*) to an updated gain value for slot 310-*d*. The updated gain value may be used to receive the remaining symbols of UE1 transmission 315 in slot 310-*d*. Alternatively, the receiving UE 115 may perform AGC but may determine that no adjustment is to be performed and may, thus, continue to use the initial gain value of slot 310-*d* for the remainder of the slot 310-*d*. If the receiving UE 115 does not perform AGC in slot 310-*d*, the initial gain value may be used to receive all symbols of UE1 transmission 310 in slot 310-*d*.

At 330-*e*, UE1 transmission 315 may cease and the gain of the receiver may return to the initial default gain (e.g., the gain at 330-*a*).

Figure 4:
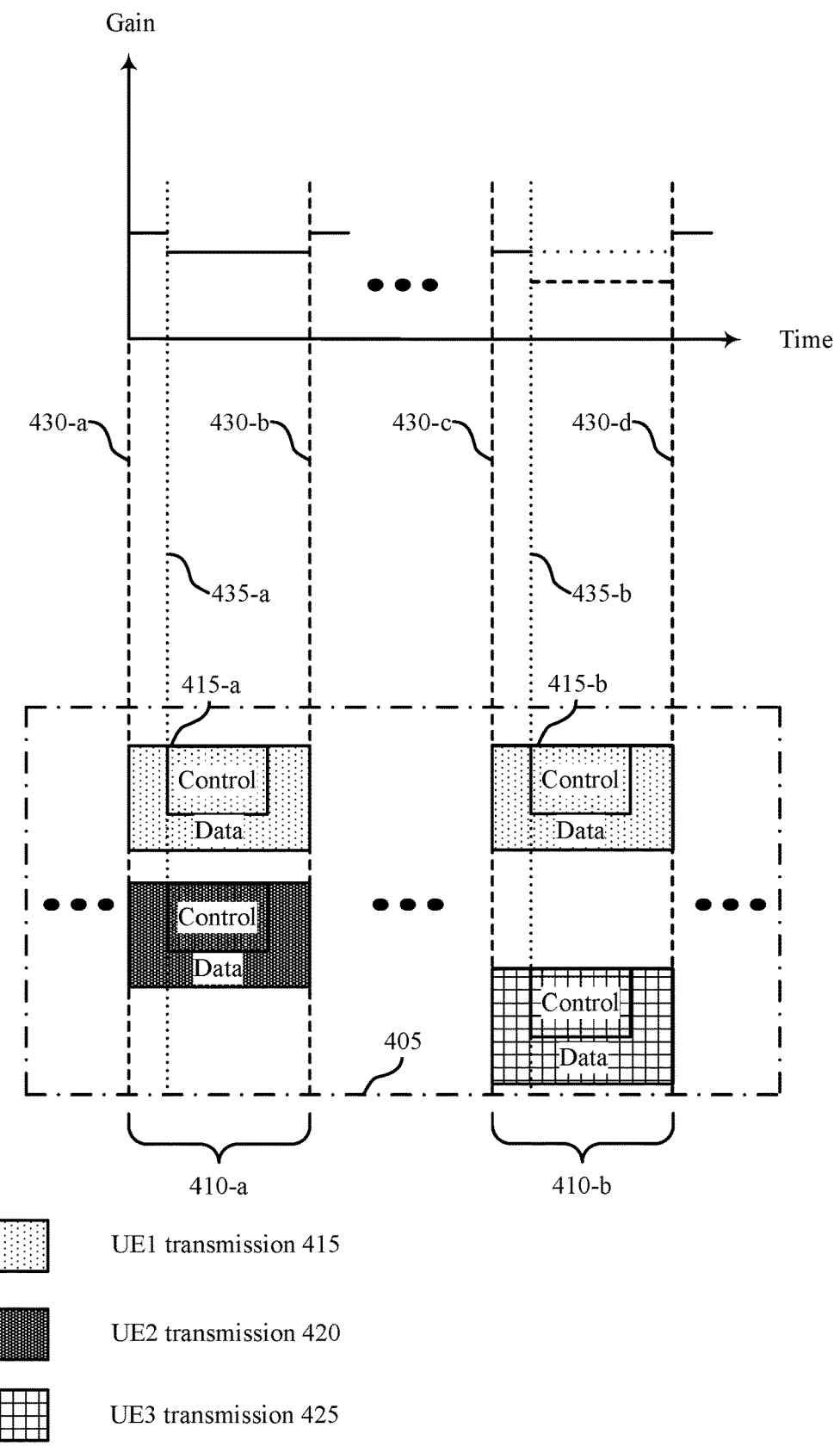
FIG. 4 illustrates an example of a resource reservation gain scheme that supports adaptive gain control for sidelink communications in accordance with aspects of the present disclosure.

FIG. 4 illustrates an example of a resource reservation gain scheme 400 that supports adaptive gain control for sidelink communications in accordance with aspects of the present disclosure. In some examples, resource reservation gain scheme 400 may be implemented by aspects of wireless communications system 100. For instance, a first UE 115 may transmit UE1 transmission 415, a second UE 115 may transmit UE2 transmission 420, and a third UE 115 may transmit UE3 transmission 425. Resource reservation gain scheme 400 may include sidelink communication grid 405 composed of a number of slots 410. Each UE transmission may span a slot 410. Additionally, each UE transmission may have a control region and a data region. UE1 transmission 415 may be a UE transmission with a resource reservation for another slot 410 (e.g., slot 410-*b*).

At 430-*a*, UE1 transmission 415-*a* and UE2 transmission 420 may arrive at a receiving UE 115. In between 430-*a* and 435-*a*, a receiver of the receiving UE 115 may receive UE1 transmission 415 and UE2 transmission 420 at a default initial gain. Additionally, in between 430-*a* and 435-*a*, the receiving UE 115 may perform AGC on UE1 transmission 415 and UE2 transmission 420. The time spanning 430-*a* and 435-*a* may represent an AGC setting time and may span one or more beginning symbols (e.g., a first symbol) of slot 410-*a*. At 435-*a*, the gain may switch to an updated gain value and the remaining symbols of slot 410-*a* may be received using the updated gain value.

The control region of UE1 transmission 415-*a* may indicate a resource for the slot 410-*b*. After receiving the indication, the receiving UE 115*a* may attempt to decode the UE1 transmission 415-*a*. If the receiving UE 115 succeeds in decoding UE1 transmission 415-*a*, the receiving UE 115 may transmit an ACK to the first UE 115 and may not determine that it is to receive a retransmission of UE1 transmission 415-*a* (e.g., UE1 transmission 415-*b*) over slot 410-*b*. As such, the receiving UE 115 may not determine a new gain for slot 410-*b* if the receiving UE1 successfully decodes UE1 transmission 415-*a*. However, if the receiving UE 115 fails to decode UE1 transmission 415-*a*, the receiving UE 115 may transmit an NACK to the first UE 115 and may determine that it is to receive a retransmission of UE1 transmission 415- (e.g., UE1 transmission 415-b) over slot 410-b.

If the receiving UE 115 fails to decode UE1 transmission 415-a, the receiving UE 115 may determine a fraction of the RSRP of the UE1 transmission 415-a to a total signal received power (e.g., an RSSI) of slot 410-a and may determine if the fraction is greater than a threshold (e.g., may determine if UE1 transmission 415-a dominates the total signal received power for slot 410-a). If the fraction is greater than the threshold, the receiving UE 115 may use the updated gain value between 430-b and 435-b to receive UE1 transmission 415-b. If the fraction is less than the threshold, the UE 115 may not determine a new gain for a beginning of slot 410-b (e.g., for in between 430-c and 435-c).

Additionally, in some cases, a spatial configuration (e.g., beams) used for reception by the receiving UE 115 in slot 410-a may be different from a spatial configuration (e.g., beams) used for reception by the receiving UE 115 in slot 410-c. In such cases, the gain value between 430-c and 435-c may be adjusted to compensate for the difference between the spatial configurations (e.g., a difference in gain).

At 430-b, UE1 transmission 415-a may cease and the gain of the receiver may return to the initial default gain (e.g., the gain at 430-a).

At 430-c, assuming that the receiving UE 115 has failed to decode UE1 transmission 415-a, the receiving UE 115 may attempt to receive UE1 transmission 415-b. If the receiving UE 115 performs AGC, the updated gain value of slot 410-a may be used to receive one or more beginning symbols (e.g., a first symbol) and may be changed after AGC is performed (e.g., at 435-c) to an updated gain value for slot 410-b. The updated gain value may be used to receive the remaining symbols of UE1 transmission 415-b. Alternatively, the receiving UE 115 may perform AGC but may determine that no adjustment is to be performed and may, thus, continue to use the initial gain value of slot 410-b for the remainder of the slot 410-b. If the receiving UE 115 does not perform AGC in slot 410-b, the initial gain value may be used to receive all symbols of UE1 transmission 415-b. If the receiving UE 115 successfully decodes UE1 transmission 415-b, the receiving UE 115 may transmit an ACK to the first UE 115. However, if the receiving UE 115 fails to decode UE1 transmission 415-b, the receiving UE 115 may transmit a NACK and may expect a retransmission of UE1 transmission 415-b at another slot 410, which may be indicated by a control region of UE1 transmission 415-b.

At 430-d, UE1 transmission 415-b may cease and the gain of the receiver may return to the initial default gain (e.g., the gain at 430-a).

Figure 5:
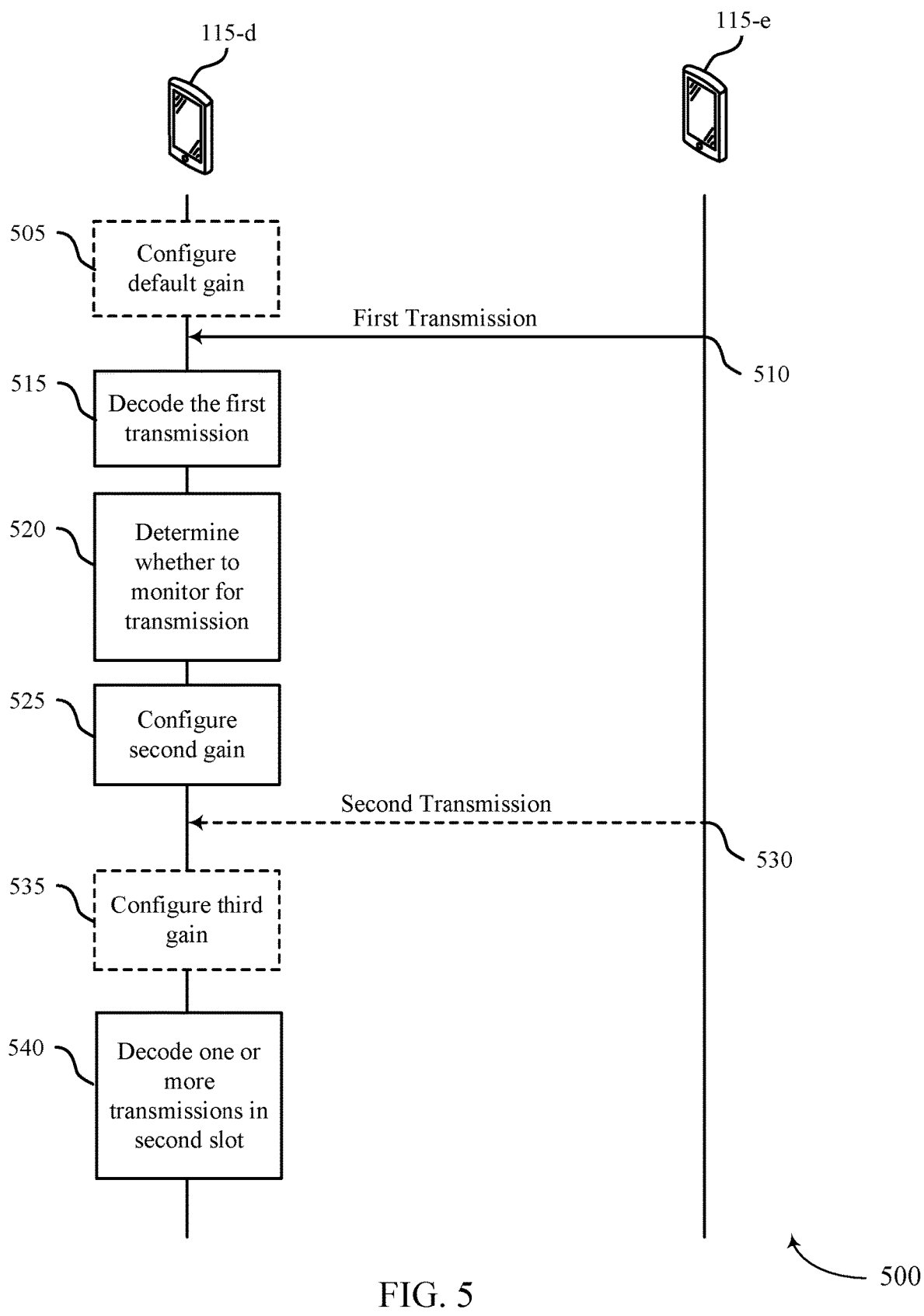
FIG. 5 illustrates an example of a process flow that supports adaptive gain control for sidelink communications in accordance with aspects of the present disclosure.

FIG. 5 illustrates an example of a process flow 500 that supports adaptive gain control for sidelink communications in accordance with aspects of the present disclosure. In some examples, process flow 500 may implement aspects of wireless communications system 100. For instance, process flow 500 may include UEs 115-d and 115-e, which may be examples of UEs 115 as described with reference to FIG. 5.

At 505, UE 115-d may configure a receiver of UE 115-d to have a default gain at a beginning of a first slot. The default gain may be based on a set of gains used to decode a set of transmissions over a set of slots prior to the first slot. For instance, the default gain may be based on performing a statistical analysis of the set of gains.

At 510, UE 115-e may transmit a first transmission. UE 115-d may receive the first transmission in the first slot. UE 115-d may receive the first transmission with the default gain and, after one or more symbols, may receive a remaining portion of the first transmission with a first gain. In some cases, the first transmission may include an indication of a second slot and may be a control transmission. The second slot may be immediately subsequent to the first slot and the indication of the second slot may be a number of slots over which UE 115-e intends to transmit. Alternatively, at least one slot may occur between the first slot and the second slot and the indication of the second slot may include an indication of a reserved resource that includes the second slot. In some cases, the first transmission may include an indication of whether a spatial configuration used by UE 115-d for reception in the first slot is the same as a spatial configuration used by UE 115-d for reception in the second slot.

At 515, UE 115-d may decode the first transmission. In some cases, UE 115-e may decode the first transmission based on configuring a receiver at the first UE to have the first gain.

At 520, UE 115-d may determine whether to monitor for a second transmission from UE 115-e in the second slot. UE 115-d may make the determination based on decoding the first transmission. For instance, UE 115-d may not correctly decode all of the first transmission and may transmit a NACK to UE 115-e. After transmitting the NACK to UE 115-e, UE 115-d may monitor for the second transmission. However, if UE 115-d correctly decodes all of the first transmission, UE 115-d may transmit an ACK to UE 115-e and may determine to not monitor for the second transmission. If the first transmission is a slot-aggregated transmission, UE 115-e may determine to monitor for the second transmission.

At 525, UE 115-d may configure the receiver of UE 115-d to have a second gain at a beginning of the second slot that is based on the first gain. UE 115-d may determine to configure the receiver with the second gain based on a fraction of a total received signal power of the first slot that is associated with a RSRP of the first transmission, a spatial configuration used by UE 115-d in the first slot, a spatial configuration used for reception by UE 115-d in the second slot, or a combination thereof. If the fraction is above a threshold, UE 115-d may configure the receiver to have the second gain. If the spatial configuration used for reception in the first slot is different from the spatial configuration used for reception in the second slot, the second gain may be determined based on the spatial configuration used for reception in the first slot being different from the spatial configuration used for reception in the second slot. In some cases, a difference between the second gain and the default gain of 505 may be based on a signal power associated with the first transmission. In some cases, the second gain may be based on UE 115-d failing to decode at least one of one or more transmissions received from UE 115-e in the first slot.

At 530, UE 115-e may transmit a second transmission. UE 115-e may transmit the second transmission if UE 115-e receives a NACK after transmitting the first transmission or if the first transmission is a slot-aggregated transmission. UE 115-d may receive the second transmission in the second slot. If the second slot is immediately subsequent to the first slot, the second transmission may be a data transmission.

At 535, UE 115-d may adjust the receiver, during the second slot, from having the second gain to having a third gain based on a second signal power observed during the second slot (e.g., at the beginning of the second slot). UE 115-d may switch to the third gain after performing AGC.

At 540, UE 115-d may decode one or more transmissions received in the second slot based on the receiver having the second gain at the beginning of the second slot. If UE 115-e transmitted the second transmission, the one or more transmissions may include the second transmission.

Figure 6:
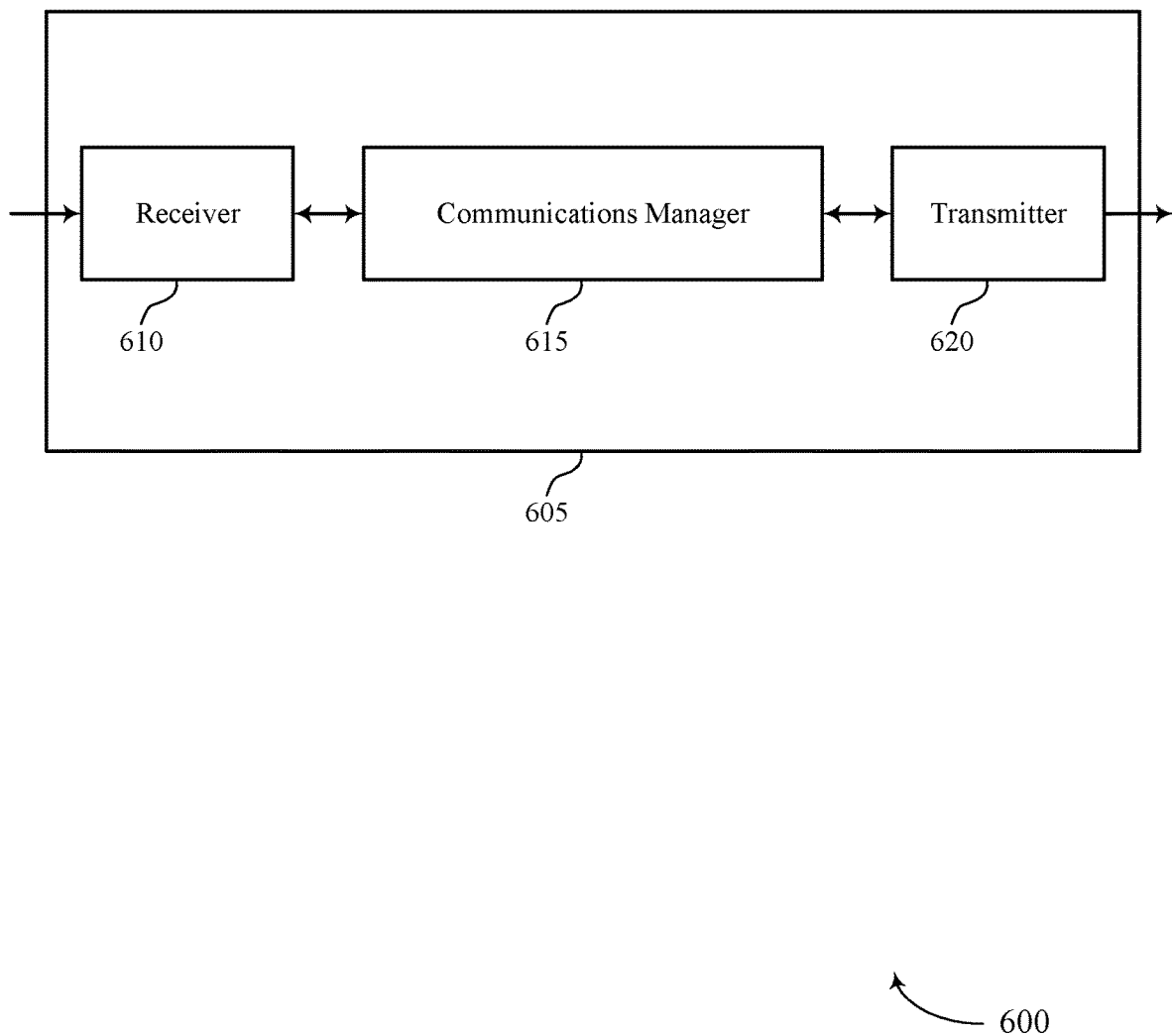
FIGS. 6 and 7 show block diagrams of devices that support adaptive gain control for sidelink communications in accordance with aspects of the present disclosure.

FIG. 6 shows a block diagram 600 of a device 605 that supports adaptive gain control for sidelink communications in accordance with aspects of the present disclosure. The device 605 may be an example of aspects of a UE 115 as described herein. The device 605 may include a receiver 610, a communications manager 615, and a transmitter 620. The device 605 may also include a processor. Each of these components may be in communication with one another (e.g., via one or more buses).

The receiver 610 may receive information such as packets, user data, or control information associated with various information channels (e.g., control channels, data channels, and information related to adaptive gain control for sidelink communications, etc.). Information may be passed on to other components of the device 605. The receiver 610 may be an example of aspects of the transceiver 920 described with reference to FIG. 9. The receiver 610 may utilize a single antenna or a set of antennas.

The communications manager 615 may receive, from a second UE, a first transmission in a first slot, decode the first transmission based on configuring a receiver at the first UE to have a first gain, decode one or more transmissions received in the second slot based on the receiver having the second gain at the beginning of the second slot, determine, based on decoding the first transmission, whether to monitor for a second transmission from the second UE in a second slot, and configure, based on determining whether to monitor for the second transmission, the receiver to have a second gain at a beginning of the second slot that is based on the first gain. The communications manager 615 may be an example of aspects of the communications manager 910 described herein.

The communications manager 615, or its sub-components, may be implemented in hardware, code (e.g., software or firmware) executed by a processor, or any combination thereof. If implemented in code executed by a processor, the functions of the communications manager 615, or its sub-components may be executed by a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described in the present disclosure.

The communications manager 615, or its sub-components, may be physically located at various positions, including being distributed such that portions of functions are implemented at different physical locations by one or more physical components. In some examples, the communications manager 615, or its sub-components, may be a separate and distinct component in accordance with various aspects of the present disclosure. In some examples, the communications manager 615, or its sub-components, may be combined with one or more other hardware components, including but not limited to an input/output (I/O) component, a transceiver, a network server, another computing device, one or more other components described in the present disclosure, or a combination thereof in accordance with various aspects of the present disclosure.

The transmitter 620 may transmit signals generated by other components of the device 605. In some examples, the transmitter 620 may be collocated with a receiver 610 in a transceiver module. For example, the transmitter 620 may be an example of aspects of the transceiver 920 described with reference to FIG. 9. The transmitter 620 may utilize a single antenna or a set of antennas.

Figure 7:
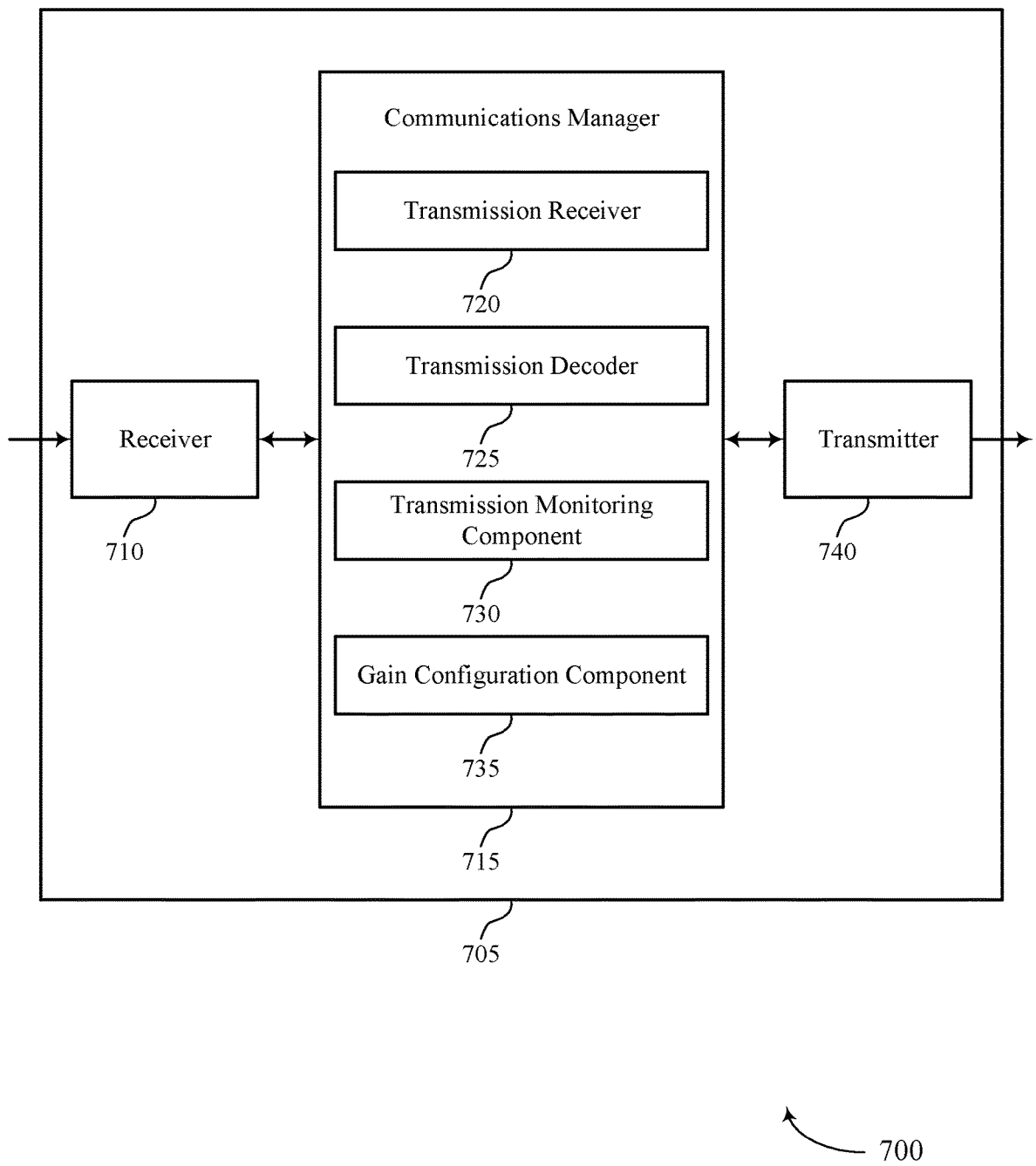

FIG. 7 shows a block diagram 700 of a device 705 that supports adaptive gain control for sidelink communications in accordance with aspects of the present disclosure. The device 705 may be an example of aspects of a device 605, or a UE 115 as described herein. The device 705 may include a receiver 710, a communications manager 715, and a transmitter 740. The device 705 may also include a processor. Each of these components may be in communication with one another (e.g., via one or more buses).

The receiver 710 may receive information such as packets, user data, or control information associated with various information channels (e.g., control channels, data channels, and information related to adaptive gain control for sidelink communications, etc.). Information may be passed on to other components of the device 705. The receiver 710 may be an example of aspects of the transceiver 920 described with reference to FIG. 9. The receiver 710 may utilize a single antenna or a set of antennas.

The communications manager 715 may be an example of aspects of the communications manager 615 as described herein. The communications manager 715 may include a transmission receiver 720, a transmission decoder 725, a transmission monitoring component 730, and a gain configuration component 735. The communications manager 715 may be an example of aspects of the communications manager 910 described herein.

The transmission receiver 720 may receive, from a second UE, a first transmission in a first slot.

The transmission decoder 725 may decode the first transmission based on configuring a receiver at the first UE to have a first gain and decode one or more transmissions received in the second slot based on the receiver having the second gain at the beginning of the second slot.

The transmission monitoring component 730 may determine, based on decoding the first transmission, whether to monitor for a second transmission from the second UE in a second slot.

The gain configuration component 735 may configure, based on determining whether to monitor for the second transmission, the receiver to have a second gain at a beginning of the second slot that is based on the first gain.

The transmitter 740 may transmit signals generated by other components of the device 705. In some examples, the transmitter 740 may be collocated with a receiver 710 in a transceiver module. For example, the transmitter 740 may be an example of aspects of the transceiver 920 described with reference to FIG. 9. The transmitter 740 may utilize a single antenna or a set of antennas.

Figure 8:
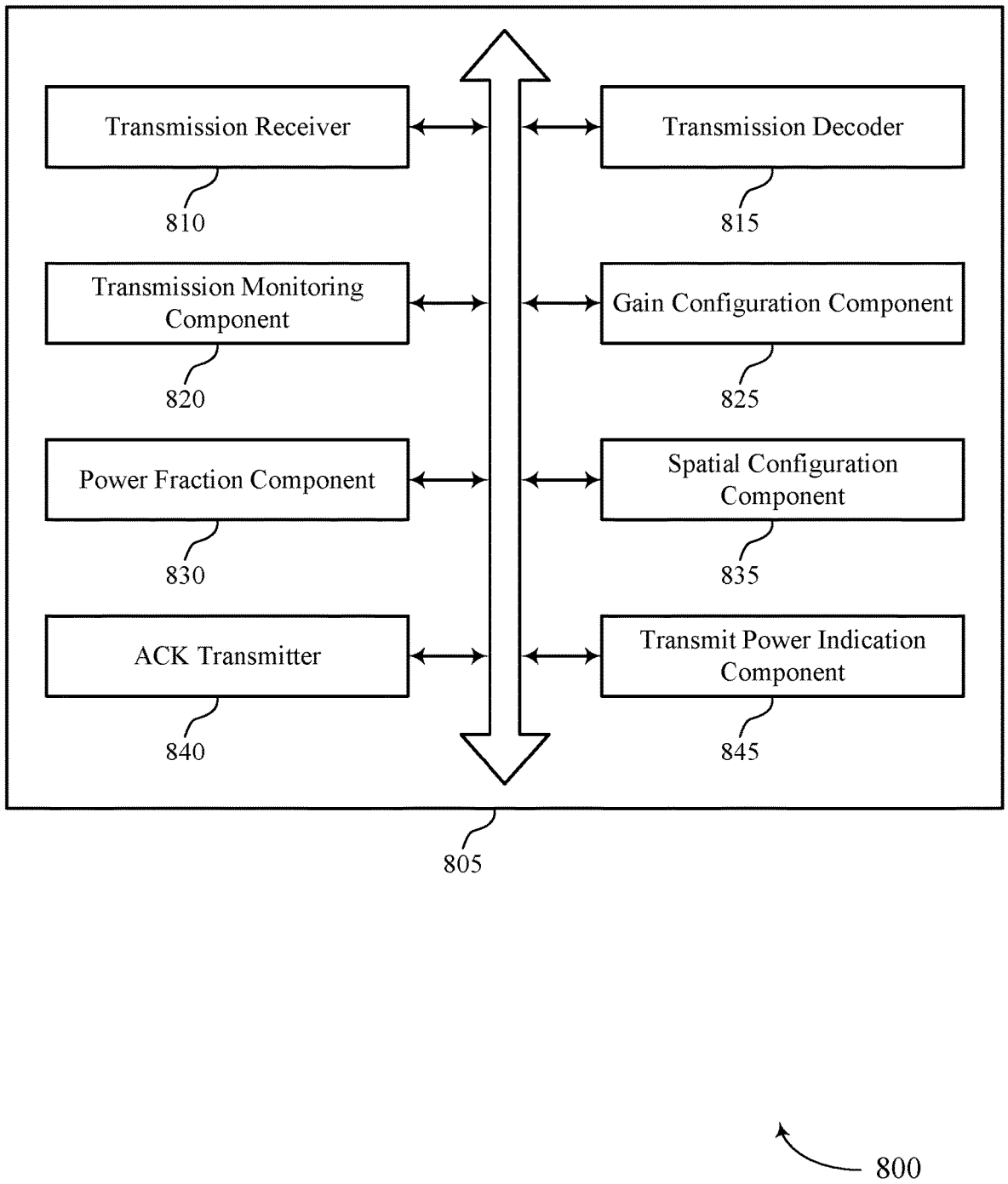
FIG. 8 shows a block diagram of a communications manager that supports adaptive gain control for sidelink communications in accordance with aspects of the present disclosure.

FIG. 8 shows a block diagram 800 of a communications manager 805 that supports adaptive gain control for sidelink communications in accordance with aspects of the present disclosure. The communications manager 805 may be an example of aspects of a communications manager 615, a communications manager 715, or a communications manager 910 described herein. The communications manager 805 may include a transmission receiver 810, a transmission decoder 815, a transmission monitoring component 820, a gain configuration component 825, a power fraction component 830, a spatial configuration component 835, an ACK transmitter 840, and a transmit power indication component 845. Each of these modules may communicate, directly or indirectly, with one another (e.g., via one or more buses).

The transmission receiver 810 may receive, from a second UE, a first transmission in a first slot. In some cases, the first transmission includes an indication of the second slot. In some cases, the first transmission includes a control transmission. In some cases, the first transmission includes an indication of whether a spatial configuration used by the first UE for reception in the first slot is the same as a spatial configuration used by the first UE for reception in the second slot. In some cases, the first transmission in the first slot and the one or more transmissions received in the second slot are directed to a third UE.

The transmission decoder 815 may decode the first transmission based on configuring a receiver at the first UE to have a first gain. In some examples, the transmission decoder 815 may decode one or more transmissions received in the second slot based on the receiver having the second gain at the beginning of the second slot.

In some examples, the transmission decoder 815 may decode the one or more transmissions based on adjusting the receiver to have the third gain. In some examples, the transmission decoder 815 may fail to decode at least one of one or more transmissions received from the second UE in the first slot, where the second gain is based on failing to decode the at least one of the one or more transmissions received in the first slot. In some examples, the transmission decoder 815 may decode all of one or more transmissions received from the second UE in the first slot, where the second gain is based on decoding all of the one or more transmissions received from the second UE in the first slot.

The transmission monitoring component 820 may determine, based on decoding the first transmission, whether to monitor for a second transmission from the second UE in a second slot. In some examples, the transmission monitoring component 820 may determine to monitor for the second transmission from the second UE based on transmitting the NACK. In some examples, the transmission monitoring component 820 may determine to not monitor for the second transmission from the second UE after decoding all of the one or more transmissions received from the second UE in the first slot. In some cases, the second slot is immediately subsequent to the first slot, and where the indication of the second slot includes a number of slots over which the second UE intends to transmit. In some cases, the second slot includes a data transmission from the second UE. In some cases, at least one slot occurs between the first slot and the second slot, and where the indication of the second slot includes an indication of a reserved resource that includes the second slot.

The gain configuration component 825 may configure, based on determining whether to monitor for the second transmission, the receiver to have a second gain at a beginning of the second slot that is based on the first gain. In some examples, the gain configuration component 825 may configure the receiver to have a default gain at a beginning of the first slot, where a difference between the second gain and the default gain is based on a signal power associated with the first transmission. In some examples, the gain configuration component 825 may adjust the receiver, during the second slot, from having the second gain to having a third gain based on a second signal power observed during the second slot. In some examples, the gain configuration component 825 may configure the receiver to have the second gain at the beginning of the second slot based on determining that the fraction is above the threshold. In some examples, the gain configuration component 825 may determine the second gain based on determining that the spatial configuration for reception in the first slot is different from the spatial configuration for reception in the second slot. In some cases, the second gain is further based on one or more of a total received signal power observed by the first UE in the first slot, a reference signal received power (RSRP) observed by the first UE for the second UE in the first slot, a spatial configuration used by the first UE for reception in the first slot, or a spatial configuration used for reception by the first UE in the second slot. In some cases, the total received signal power includes a received signal strength indicator (RSSI) for the first slot. In some cases, the second gain is a default initial gain. In some cases, the second gain is equal to the first gain. In some examples, the gain configuration component 825 may determine the default gain based on a plurality of gains used to decode a plurality of transmissions over a plurality of slots prior to the first slot. In some cases, determining the default gain based on the plurality of gains includes performing a statistical analysis of the plurality of gains.

The power fraction component 830 may determine, based on the RSRP for the second UE, a fraction of the total received signal power associated with the second UE, where the second gain is based on the fraction. In some examples, the power fraction component 830 may determine that the fraction is above a threshold.

The spatial configuration component 835 may determine that the spatial configuration used for reception in the first slot is different from the spatial configuration used for reception in the second slot.

The ACK transmitter 840 may transmit a NACK to the second UE after failing to decode the at least one of the one or more transmissions received in the first slot.

The transmit power indication component 845 may transmit, to the second UE, an indication of a transmit power to use for the second transmission, where the second gain is based on the indicated transmit power.

Figure 9:
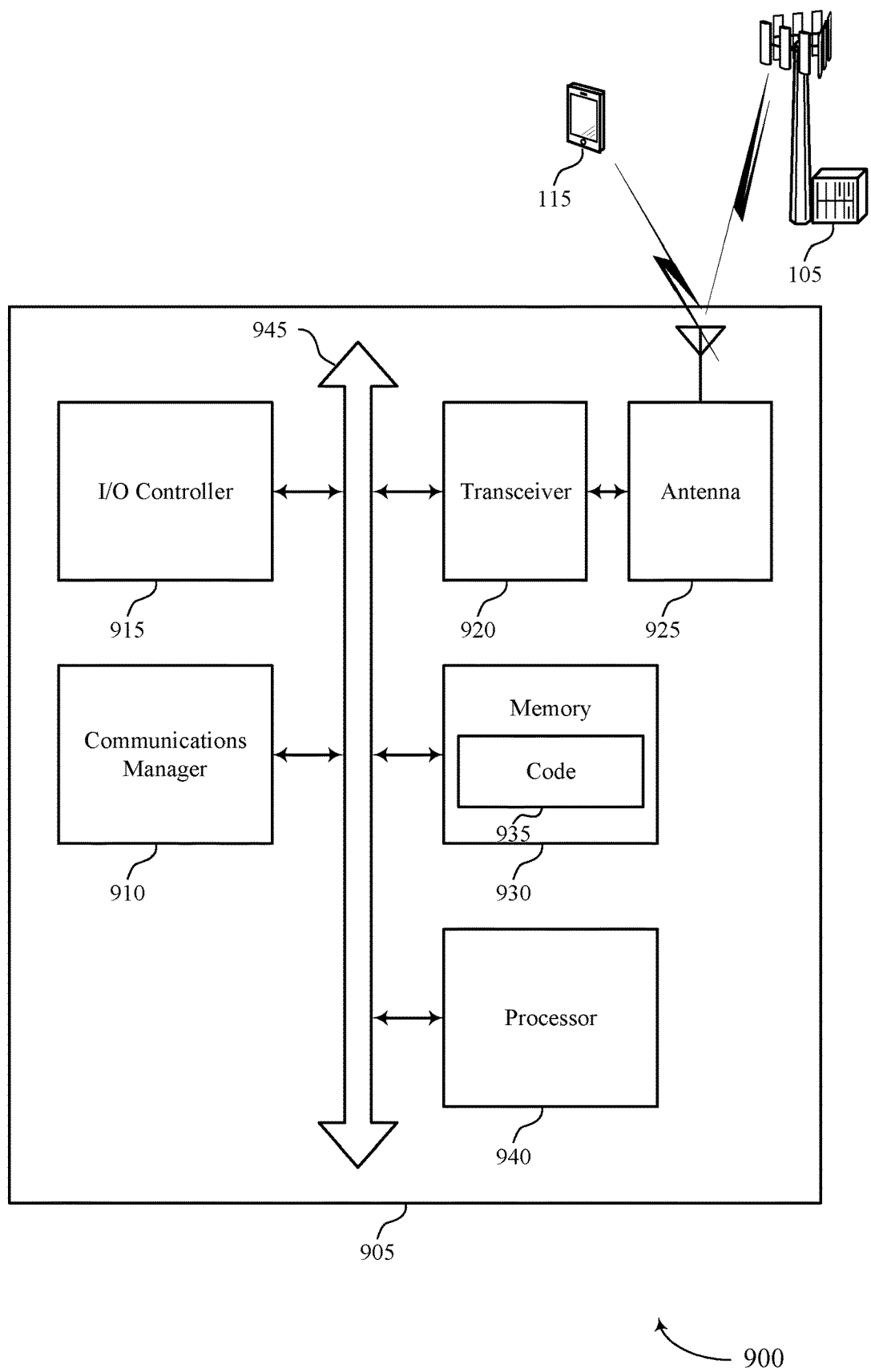
FIG. 9 shows a diagram of a system including a device that supports adaptive gain control for sidelink communications in accordance with aspects of the present disclosure.

FIG. 9 shows a diagram of a system 900 including a device 905 that supports adaptive gain control for sidelink communications in accordance with aspects of the present disclosure. The device 905 may be an example of or include the components of device 605, device 705, or a UE 115 as described herein. The device 905 may include components for bi-directional voice and data communications including components for transmitting and receiving communications, including a communications manager 910, an I/O controller 915, a transceiver 920, an antenna 925, memory 930, and a processor 940. These components may be in electronic communication via one or more buses (e.g., bus 945).

The communications manager 910 may receive, from a second UE, a first transmission in a first slot, decode the first transmission based on configuring a receiver at the first UE to have a first gain, decode one or more transmissions received in the second slot based on the receiver having the second gain at the beginning of the second slot, determine, based on decoding the first transmission, whether to monitor for a second transmission from the second UE in a second slot, and configure, based on determining whether to monitor for the second transmission, the receiver to have a second gain at a beginning of the second slot that is based on the first gain.

The I/O controller 915 may manage input and output signals for the device 905. The I/O controller 915 may also manage peripherals not integrated into the device 905. In some cases, the I/O controller 915 may represent a physical connection or port to an external peripheral. In some cases, the I/O controller 915 may utilize an operating system such as iOS®, ANDROID®, MS-DOS®, MS-WINDOWS®, OS/2®, UNIX®, LINUX®, or another known operating system. In other cases, the I/O controller 915 may represent or interact with a modem, a keyboard, a mouse, a touchscreen, or a similar device. In some cases, the I/O controller 915 may be implemented as part of a processor. In some cases, a user may interact with the device 905 via the I/O controller 915 or via hardware components controlled by the I/O controller 915.

The transceiver 920 may communicate bi-directionally, via one or more antennas, wired, or wireless links as described above. For example, the transceiver 920 may represent a wireless transceiver and may communicate bi-directionally with another wireless transceiver. The transceiver 920 may also include a modem to modulate the packets and provide the modulated packets to the antennas for transmission, and to demodulate packets received from the antennas.

In some cases, the wireless device may include a single antenna 925. However, in some cases the device may have more than one antenna 925, which may be capable of concurrently transmitting or receiving multiple wireless transmissions.

The memory 930 may include random-access memory (RAM) and read-only memory (ROM). The memory 930 may store computer-readable, computer-executable code 935 including instructions that, when executed, cause the processor to perform various functions described herein. In some cases, the memory 930 may contain, among other things, a basic input/output system (BIOS) which may control basic hardware or software operation such as the interaction with peripheral components or devices.

The processor 940 may include an intelligent hardware device, (e.g., a general-purpose processor, a DSP, a CPU, a microcontroller, an ASIC, an FPGA, a programmable logic device, a discrete gate or transistor logic component, a discrete hardware component, or any combination thereof). In some cases, the processor 940 may be configured to operate a memory array using a memory controller. In other cases, a memory controller may be integrated into the processor 940. The processor 940 may be configured to execute computer-readable instructions stored in a memory (e.g., the memory 930) to cause the device 905 to perform various functions (e.g., functions or tasks supporting adaptive gain control for sidelink communications).

The code 935 may include instructions to implement aspects of the present disclosure, including instructions to support wireless communications. The code 935 may be stored in a non-transitory computer-readable medium such as system memory or other type of memory. In some cases, the code 935 may not be directly executable by the processor 940 but may cause a computer (e.g., when compiled and executed) to perform functions described herein.

Figure 10:
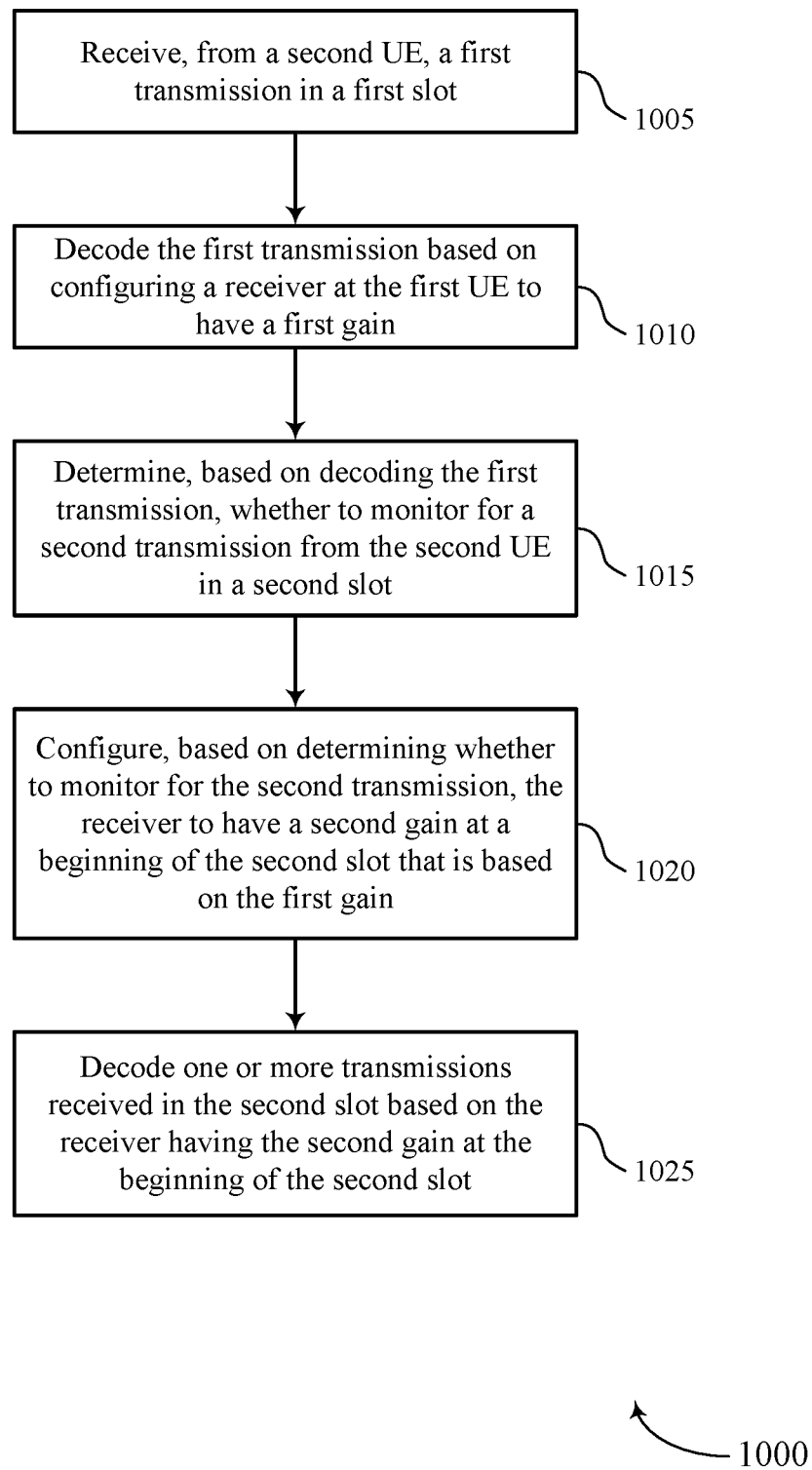
FIGS. 10 through 15 show flowcharts illustrating methods that support adaptive gain control for sidelink communications in accordance with aspects of the present disclosure.

FIG. 10 shows a flowchart illustrating a method 1000 that supports adaptive gain control for sidelink communications in accordance with aspects of the present disclosure. The operations of method 1000 may be implemented by a UE 115 or its components as described herein. For example, the operations of method 1000 may be performed by a communications manager as described with reference to FIGS. 6 through 9. In some examples, a UE may execute a set of instructions to control the functional elements of the UE to perform the functions described below. Additionally or alternatively, a UE may perform aspects of the functions described below using special-purpose hardware.

At 1005, the UE may receive, from a second UE, a first transmission in a first slot. The operations of 1005 may be performed according to the methods described herein. In some examples, aspects of the operations of 1005 may be performed by a transmission receiver as described with reference to FIGS. 6 through 9.

At 1010, the UE may decode the first transmission based on configuring a receiver at the first UE to have a first gain. The operations of 1010 may be performed according to the methods described herein. In some examples, aspects of the operations of 1010 may be performed by a transmission decoder as described with reference to FIGS. 6 through 9.

At 1015, the UE may determine, based on decoding the first transmission, whether to monitor for a second transmission from the second UE in a second slot. The operations of 1015 may be performed according to the methods described herein. In some examples, aspects of the operations of 1015 may be performed by a transmission monitoring component as described with reference to FIGS. 6 through 9.

At 1020, the UE may configure, based on determining whether to monitor for the second transmission, the receiver to have a second gain at a beginning of the second slot that is based on the first gain. The operations of 1020 may be performed according to the methods described herein. In some examples, aspects of the operations of 1020 may be performed by a gain configuration component as described with reference to FIGS. 6 through 9.

At 1025, the UE may decode one or more transmissions received in the second slot based on the receiver having the second gain at the beginning of the second slot. The operations of 1025 may be performed according to the methods described herein. In some examples, aspects of the operations of 1025 may be performed by a transmission decoder as described with reference to FIGS. 6 through 9.

Figure 11:
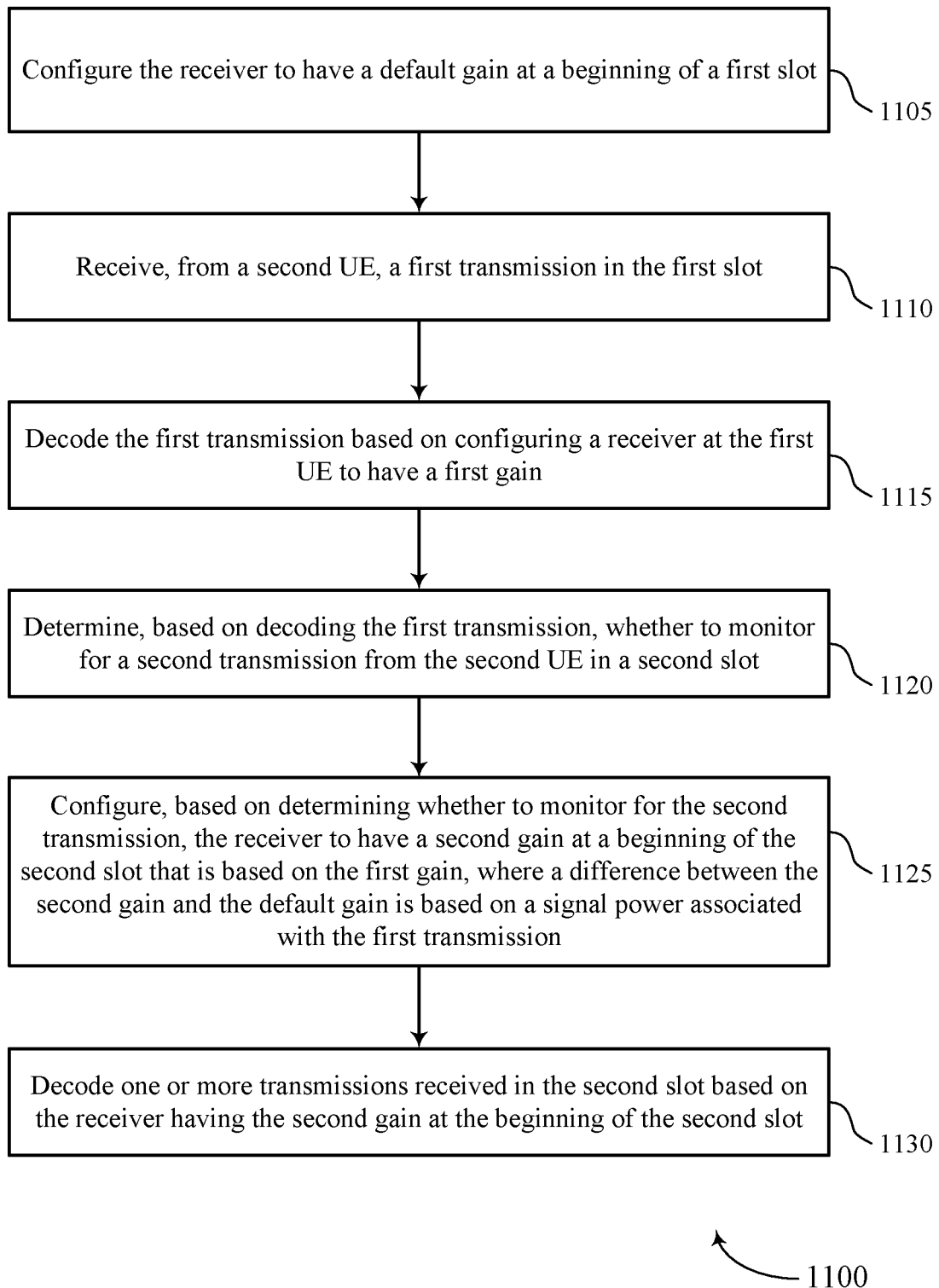

FIG. 11 shows a flowchart illustrating a method 1100 that supports adaptive gain control for sidelink communications in accordance with aspects of the present disclosure. The operations of method 1100 may be implemented by a UE 115 or its components as described herein. For example, the operations of method 1100 may be performed by a communications manager as described with reference to FIGS. 6 through 9. In some examples, a UE may execute a set of instructions to control the functional elements of the UE to perform the functions described below. Additionally or alternatively, a UE may perform aspects of the functions described below using special-purpose hardware.

At 1105, the UE may configure the receiver to have a default gain at a beginning of a first slot. The operations of 1105 may be performed according to the methods described herein. In some examples, aspects of the operations of 1105 may be performed by a gain configuration component as described with reference to FIGS. 6 through 9.

At 1110, the UE may receive, from a second UE, a first transmission in the first slot. The operations of 1110 may be performed according to the methods described herein. In some examples, aspects of the operations of 1110 may be performed by a transmission receiver as described with reference to FIGS. 6 through 9.

At 1115, the UE may decode the first transmission based on configuring a receiver at the first UE to have a first gain. The operations of 1115 may be performed according to the methods described herein. In some examples, aspects of the operations of 1115 may be performed by a transmission decoder as described with reference to FIGS. 6 through 9.

At 1120, the UE may determine, based on decoding the first transmission, whether to monitor for a second transmission from the second UE in a second slot. The operations of 1120 may be performed according to the methods described herein. In some examples, aspects of the operations of 1120 may be performed by a transmission monitoring component as described with reference to FIGS. 6 through 9.

At 1125, the UE may configure, based on determining whether to monitor for the second transmission, the receiver to have a second gain at a beginning of the second slot that is based on the first gain, where a difference between the second gain and the default gain is based on a signal power associated with the first transmission. The operations of 1125 may be performed according to the methods described herein. In some examples, aspects of the operations of 1125 may be performed by a gain configuration component as described with reference to FIGS. 6 through 9.

At 1130, the UE may decode one or more transmissions received in the second slot based on the receiver having the second gain at the beginning of the second slot. The operations of 1130 may be performed according to the methods described herein. In some examples, aspects of the operations of 1130 may be performed by a transmission decoder as described with reference to FIGS. 6 through 9.

Figure 12:
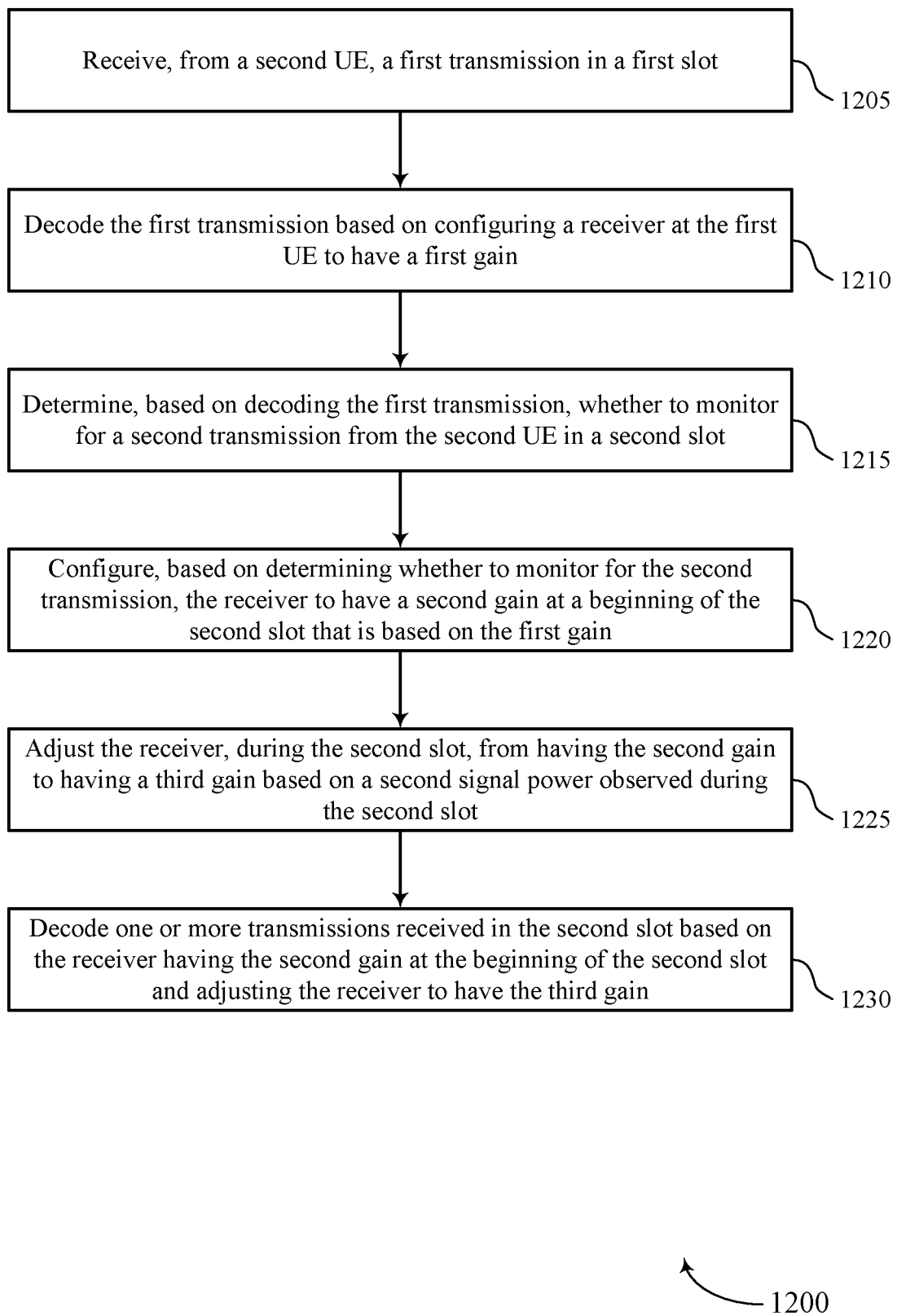

FIG. 12 shows a flowchart illustrating a method 1200 that supports adaptive gain control for sidelink communications in accordance with aspects of the present disclosure. The operations of method 1200 may be implemented by a UE 115 or its components as described herein. For example, the operations of method 1200 may be performed by a communications manager as described with reference to FIGS. 6 through 9. In some examples, a UE may execute a set of instructions to control the functional elements of the UE to perform the functions described below. Additionally or alternatively, a UE may perform aspects of the functions described below using special-purpose hardware.

At 1205, the UE may receive, from a second UE, a first transmission in a first slot. The operations of 1205 may be performed according to the methods described herein. In some examples, aspects of the operations of 1205 may be performed by a transmission receiver as described with reference to FIGS. 6 through 9.

At 1210, the UE may decode the first transmission based on configuring a receiver at the first UE to have a first gain. The operations of 1210 may be performed according to the methods described herein. In some examples, aspects of the operations of 1210 may be performed by a transmission decoder as described with reference to FIGS. 6 through 9.

At 1215, the UE may determine, based on decoding the first transmission, whether to monitor for a second transmission from the second UE in a second slot. The operations of 1215 may be performed according to the methods described herein. In some examples, aspects of the operations of 1215 may be performed by a transmission monitoring component as described with reference to FIGS. 6 through 9.

At 1220, the UE may configure, based on determining whether to monitor for the second transmission, the receiver to have a second gain at a beginning of the second slot that is based on the first gain. The operations of 1220 may be performed according to the methods described herein. In some examples, aspects of the operations of 1220 may be performed by a gain configuration component as described with reference to FIGS. 6 through 9.

At 1225, the UE may adjust the receiver, during the second slot, from having the second gain to having a third gain based on a second signal power observed during the second slot. The operations of 1225 may be performed according to the methods described herein. In some examples, aspects of the operations of 1225 may be performed by a gain configuration component as described with reference to FIGS. 6 through 9.

At 1230, the UE may decode one or more transmissions received in the second slot based on the receiver having the second gain at the beginning of the second slot and adjusting the receiver to have the third gain. The operations of 1230 may be performed according to the methods described herein. In some examples, aspects of the operations of 1230 may be performed by a transmission decoder as described with reference to FIGS. 6 through 9.

Figure 13:
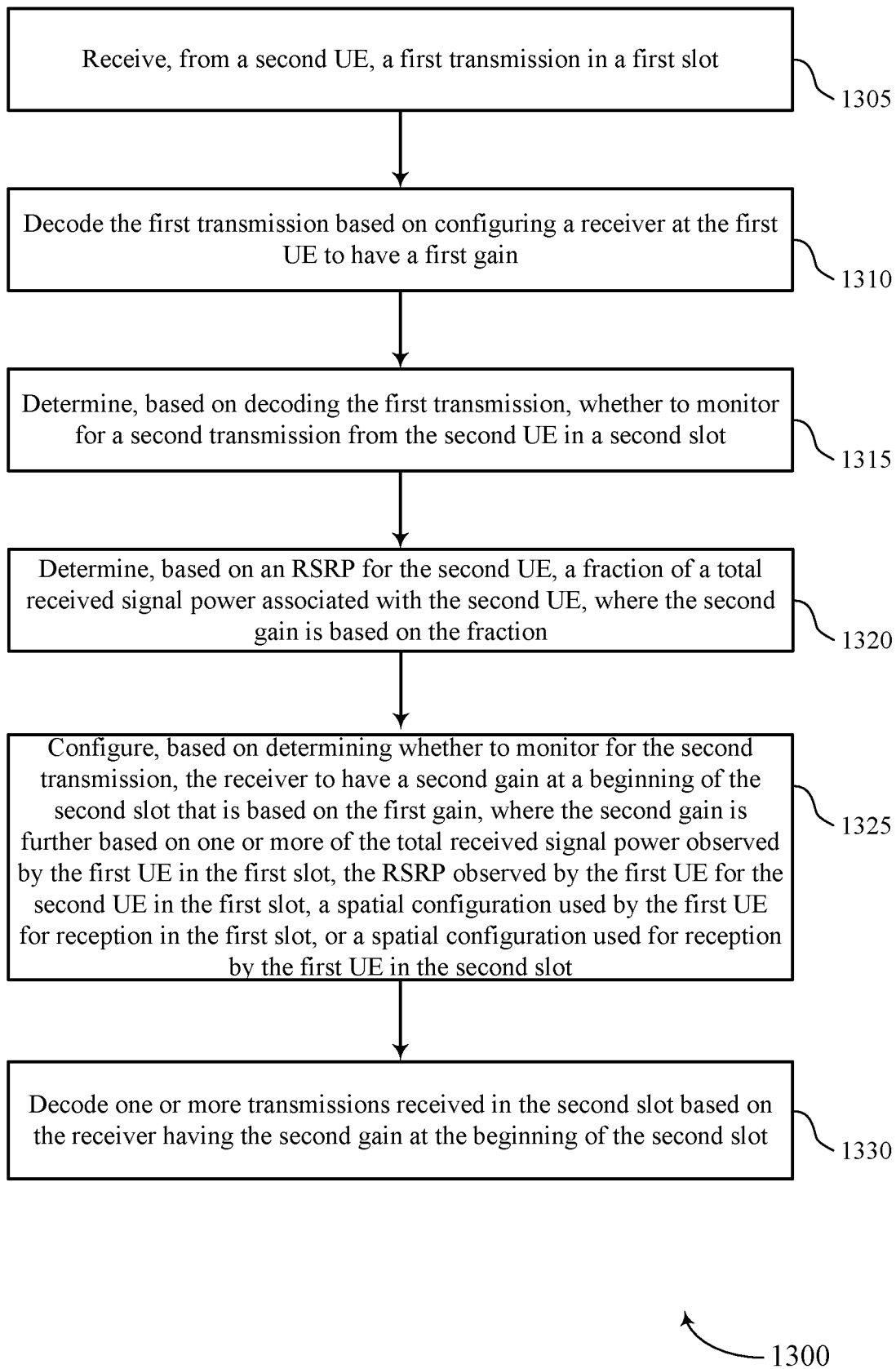

FIG. 13 shows a flowchart illustrating a method 1300 that supports adaptive gain control for sidelink communications in accordance with aspects of the present disclosure. The operations of method 1300 may be implemented by a UE 115 or its components as described herein. For example, the operations of method 1300 may be performed by a communications manager as described with reference to FIGS. 6 through 9. In some examples, a UE may execute a set of instructions to control the functional elements of the UE to perform the functions described below. Additionally or alternatively, a UE may perform aspects of the functions described below using special-purpose hardware.

At 1305, the UE may receive, from a second UE, a first transmission in a first slot. The operations of 1305 may be performed according to the methods described herein. In some examples, aspects of the operations of 1305 may be performed by a transmission receiver as described with reference to FIGS. 6 through 9.

At 1310, the UE may decode the first transmission based on configuring a receiver at the first UE to have a first gain. The operations of 1310 may be performed according to the methods described herein. In some examples, aspects of the operations of 1310 may be performed by a transmission decoder as described with reference to FIGS. 6 through 9.

At 1315, the UE may determine, based on decoding the first transmission, whether to monitor for a second transmission from the second UE in a second slot. The operations of 1315 may be performed according to the methods described herein. In some examples, aspects of the operations of 1315 may be performed by a transmission monitoring component as described with reference to FIGS. 6 through 9.

At 1320, the UE may determine, based on an RSRP for the second UE, a fraction of a total received signal power associated with the second UE, where the second gain is based on the fraction. The operations of 1320 may be performed according to the methods described herein. In some examples, aspects of the operations of 1320 may be performed by a power fraction component as described with reference to FIGS. 6 through 9.

At 1325, the UE may configure, based on determining whether to monitor for the second transmission, the receiver to have a second gain at a beginning of the second slot that is based on the first gain, where the second gain is further based on one or more of the total received signal power observed by the first UE in the first slot, the RSRP observed by the first UE for the second UE in the first slot, a spatial configuration used by the first UE for reception in the first slot, or a spatial configuration used for reception by the first UE in the second slot. The operations of 1325 may be performed according to the methods described herein. In some examples, aspects of the operations of 1325 may be performed by a gain configuration component as described with reference to FIGS. 6 through 9.

At 1330, the UE may decode one or more transmissions received in the second slot based on the receiver having the second gain at the beginning of the second slot. The operations of 1330 may be performed according to the methods described herein. In some examples, aspects of the operations of 1330 may be performed by a transmission decoder as described with reference to FIGS. 6 through 9.

Figure 14:
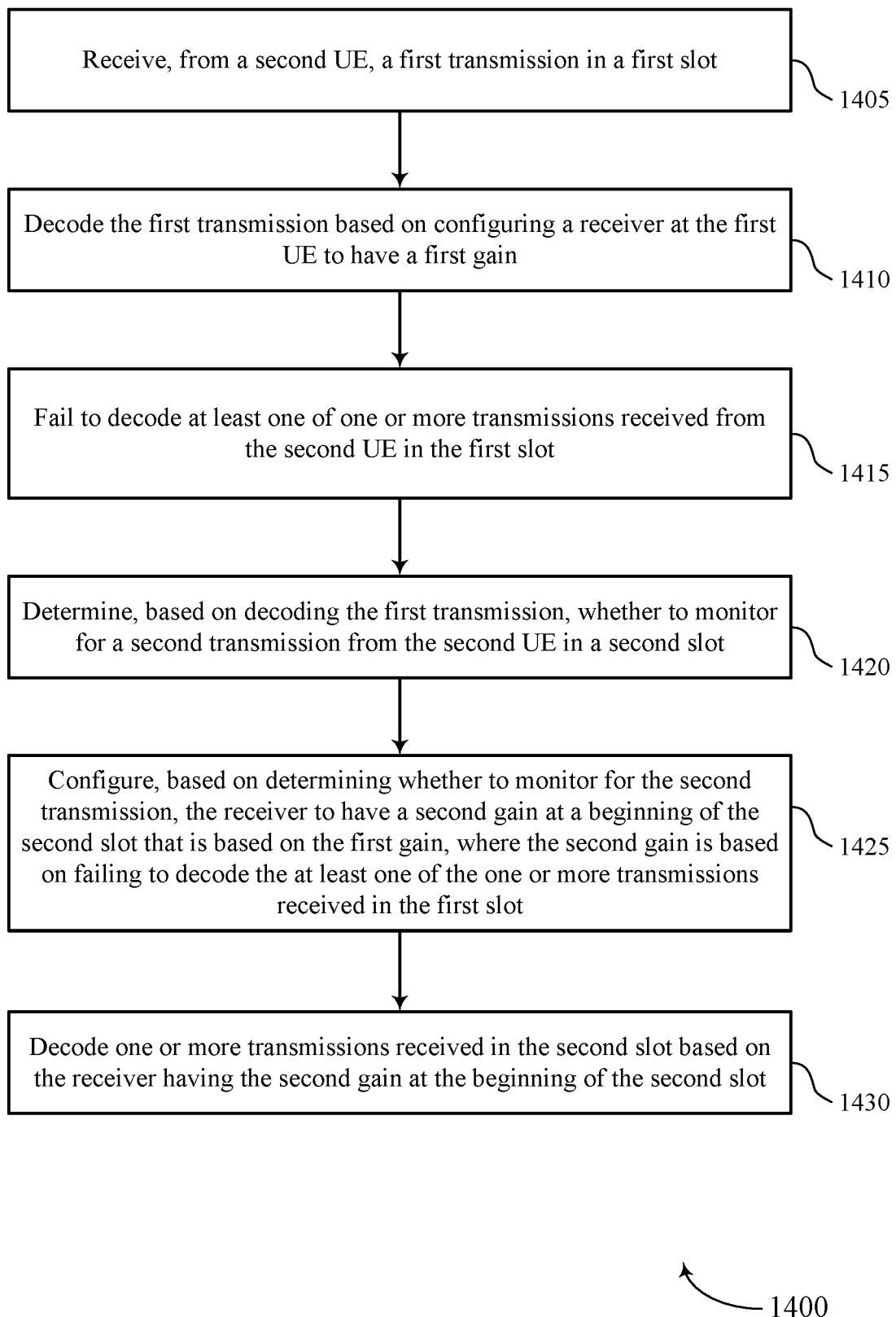

FIG. 14 shows a flowchart illustrating a method 1400 that supports adaptive gain control for sidelink communications in accordance with aspects of the present disclosure. The operations of method 1400 may be implemented by a UE 115 or its components as described herein. For example, the operations of method 1400 may be performed by a communications manager as described with reference to FIGS. 6 through 9. In some examples, a UE may execute a set of instructions to control the functional elements of the UE to perform the functions described below. Additionally or alternatively, a UE may perform aspects of the functions described below using special-purpose hardware.

At 1405, the UE may receive, from a second UE, a first transmission in a first slot. The operations of 1405 may be performed according to the methods described herein. In some examples, aspects of the operations of 1405 may be performed by a transmission receiver as described with reference to FIGS. 6 through 9.

At 1410, the UE may decode the first transmission based on configuring a receiver at the first UE to have a first gain. The operations of 1410 may be performed according to the methods described herein. In some examples, aspects of the operations of 1410 may be performed by a transmission decoder as described with reference to FIGS. 6 through 9.

At 1415, the UE may fail to decode at least one of one or more transmissions received from the second UE in the first slot. The operations of 1415 may be performed according to the methods described herein. In some examples, aspects of the operations of 1415 may be performed by a transmission decoder as described with reference to FIGS. 6 through 9.

At 1420, the UE may determine, based on decoding the first transmission, whether to monitor for a second transmission from the second UE in a second slot. The operations of 1420 may be performed according to the methods described herein. In some examples, aspects of the operations of 1420 may be performed by a transmission monitoring component as described with reference to FIGS. 6 through 9.

At 1425, the UE may configure, based on determining whether to monitor for the second transmission, the receiver to have a second gain at a beginning of the second slot that is based on the first gain, where the second gain is based on failing to decode the at least one of the one or more transmissions received in the first slot. The operations of 1425 may be performed according to the methods described herein. In some examples, aspects of the operations of 1425 may be performed by a gain configuration component as described with reference to FIGS. 6 through 9.

At 1430, the UE may decode one or more transmissions received in the second slot based on the receiver having the second gain at the beginning of the second slot. The operations of 1430 may be performed according to the methods described herein. In some examples, aspects of the operations of 1430 may be performed by a transmission decoder as described with reference to FIGS. 6 through 9.

Figure 15:
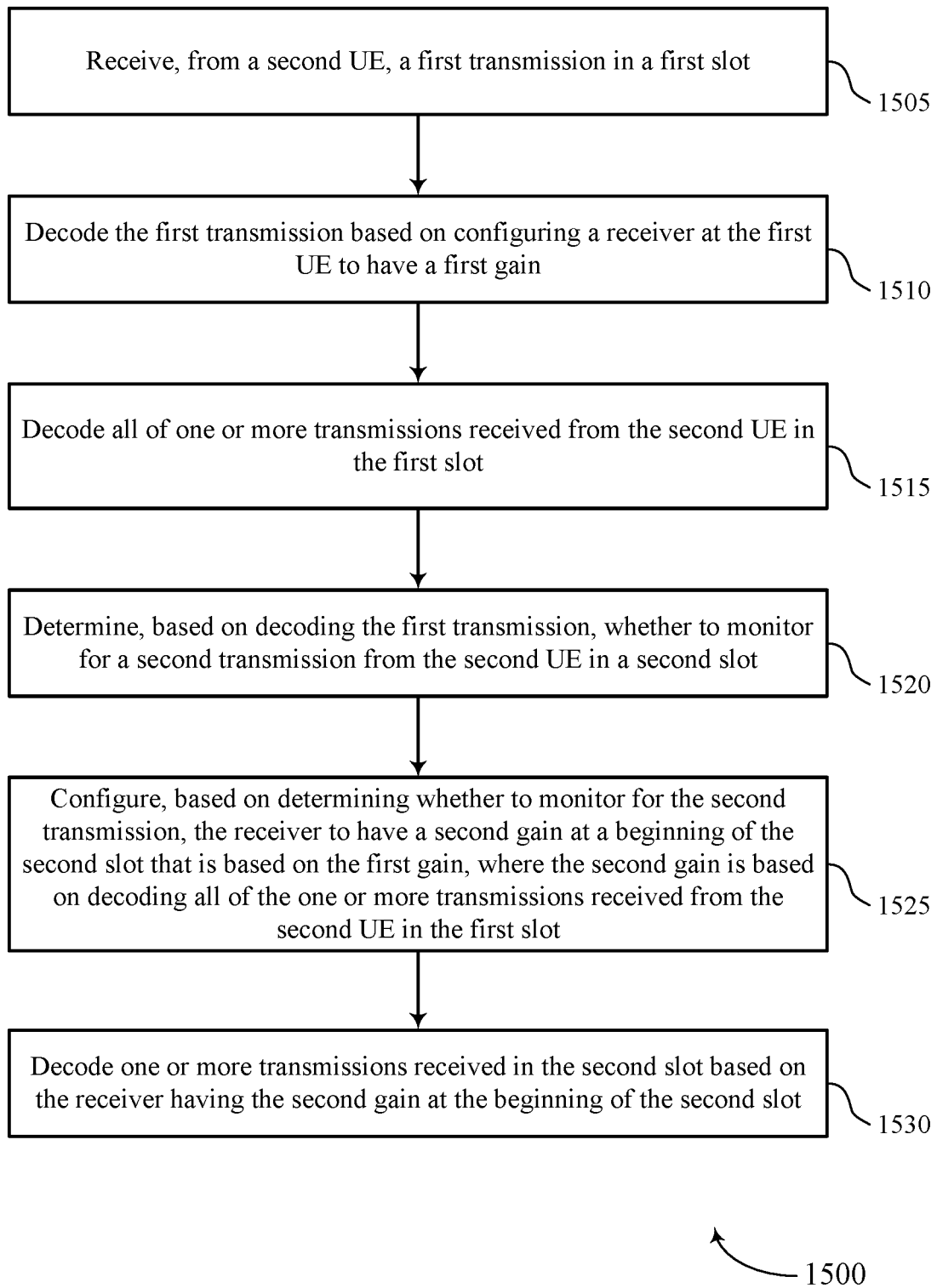

FIG. 15 shows a flowchart illustrating a method 1500 that supports adaptive gain control for sidelink communications in accordance with aspects of the present disclosure. The operations of method 1500 may be implemented by a UE 115 or its components as described herein. For example, the operations of method 1500 may be performed by a communications manager as described with reference to FIGS. 6 through 9. In some examples, a UE may execute a set of instructions to control the functional elements of the UE to perform the functions described below. Additionally or alternatively, a UE may perform aspects of the functions described below using special-purpose hardware.

At 1505, the UE may receive, from a second UE, a first transmission in a first slot. The operations of 1505 may be performed according to the methods described herein. In some examples, aspects of the operations of 1505 may be performed by a transmission receiver as described with reference to FIGS. 6 through 9.

At 1510, the UE may decode the first transmission based on configuring a receiver at the first UE to have a first gain. The operations of 1510 may be performed according to the methods described herein. In some examples, aspects of the operations of 1510 may be performed by a transmission decoder as described with reference to FIGS. 6 through 9.

At 1515, the UE may decode all of one or more transmissions received from the second UE in the first slot. The operations of 1515 may be performed according to the methods described herein. In some examples, aspects of the operations of 1515 may be performed by a transmission decoder as described with reference to FIGS. 6 through 9.

At 1520, the UE may determine, based on decoding the first transmission, whether to monitor for a second transmission from the second UE in a second slot. The operations of 1520 may be performed according to the methods described herein. In some examples, aspects of the operations of 1520 may be performed by a transmission monitoring component as described with reference to FIGS. 6 through 9.

At 1525, the UE may configure, based on determining whether to monitor for the second transmission, the receiver to have a second gain at a beginning of the second slot that is based on the first gain, where the second gain is based on decoding all of the one or more transmissions received from the second UE in the first slot. The operations of 1525 may be performed according to the methods described herein. In some examples, aspects of the operations of 1525 may be performed by a gain configuration component as described with reference to FIGS. 6 through 9.

At 1530, the UE may decode one or more transmissions received in the second slot based on the receiver having the second gain at the beginning of the second slot. The operations of 1530 may be performed according to the methods described herein. In some examples, aspects of the operations of 1530 may be performed by a transmission decoder as described with reference to FIGS. 6 through 9.

It should be noted that the methods described herein describe possible implementations, and that the operations and the steps may be rearranged or otherwise modified and that other implementations are possible. Further, aspects from two or more of the methods may be combined.

Aspects of the following examples may be combined with any of the previous examples or aspects described herein. Thus, example 1 is a method for wireless communication at a first UE including: receiving, from a second UE, a first transmission in a first slot; decoding the first transmission based at least in part on configuring a receiver at the first UE to have a first gain; determining, based at least in part on decoding the first transmission, whether to monitor for a second transmission from the second UE in a second slot; configuring, based at least in part on determining whether to monitor for the second transmission, the receiver to have a second gain at a beginning of the second slot that is based at least in part on the first gain; and decoding one or more transmissions received in the second slot based at least in part on the receiver having the second gain at the beginning of the second slot.

In example 2, the method of example 1 may include: configuring the receiver to have a default gain at a beginning of the first slot, wherein a difference between the second gain and the default gain is based at least in part on a signal power associated with the first transmission.

In example 3, the method of examples 1-2 may include: determining the default gain based at least in part on a plurality of gains used to decode a plurality of transmissions over a plurality of slots prior to the first slot.

In example 4, in the method of examples 1-3, the determining the default gain may be based at least in part on the plurality of gains comprises performing a statistical analysis of the plurality of gains.

In example 5, decoding the one or more transmissions received in the second slot in the methods of examples 1-4 may include: adjusting the receiver, during the second slot, from having the second gain to having a third gain based at least in part on a second signal power observed during the second slot; and decoding the one or more transmissions based at least in part on adjusting the receiver to have the third gain.

In example 6, in the methods of examples 1-5, the second gain may be further based at least in part on one or more of a total received signal power observed by the first UE in the first slot, a reference signal received power (RSRP) observed by the first UE for the second UE in the first slot, a spatial configuration used by the first UE for reception in the first slot, or a spatial configuration used for reception by the first UE in the second slot.

In example 7, the methods of examples 1-6 may include: determining, based at least in part on the RSRP for the second UE, a fraction of the total received signal power associated with the second UE, wherein the second gain is based at least in part on the fraction.

In example 8, the methods of examples 1-7 may include: determining that the fraction is above a threshold; and configuring the receiver to have the second gain at the beginning of the second slot based at least in part on determining that the fraction is above the threshold.

In example 9, the methods of examples 1-8 may include: determining that the spatial configuration used for reception in the first slot is different from the spatial configuration used for reception in the second slot; and determining the second gain based at least in part on determining that the spatial configuration for reception in the first slot is different from the spatial configuration for reception in the second slot.

In example 10, in the methods of examples 1-9, the total received signal power may include a received signal strength indicator (RSSI) for the first slot.

In example 11, in the methods of examples 1-10, the first transmission may include an indication of the second slot.

In example 12, in the methods of examples 1-11, the first transmission may include a control transmission.

In example 13, in the methods of examples 1-12, the second slot may be immediately subsequent to the first slot, and the indication of the second slot may include a number of slots over which the second UE intends to transmit.

In example 14, in the methods of examples 1-13, the second slot may include a data transmission from the second UE.

In example 15, in the methods of examples 1-14, at least one slot may occur between the first slot and the second slot, and the indication of the second slot may include an indication of a reserved resource that includes the second slot.

In example 16, in the methods of examples 1-15, the first transmission includes an indication of whether a spatial configuration used by the first UE for reception in the first slot is the same as a spatial configuration used by the first UE for reception in the second slot.

In example 17, the methods of examples 1-16 may include: failing to decode at least one of one or more transmissions received from the second UE in the first slot, wherein the second gain is based at least in part on failing to decode the at least one of the one or more transmissions received in the first slot.

In example 18, the methods of examples 1-17 may include: transmitting a negative acknowledgement (NACK) to the second UE after failing to decode the at least one of the one or more transmissions received in the first slot.

In example 19, the methods of examples 1-18 may include: determining to monitor for the second transmission from the second UE based at least in part on transmitting the NACK.

In example 20, the methods of examples 1-19 may include: decoding all of one or more transmissions received from the second UE in the first slot, wherein the second gain is based at least in part on decoding all of the one or more transmissions received from the second UE in the first slot.

In example 21, the methods of examples 1-20 may include: determining to not monitor for the second transmission from the second UE after decoding all of the one or more transmissions received from the second UE in the first slot.

In example 22, in the methods of examples 1-21, the second gain may be a default initial gain.

In example 23, in the methods of examples 1-22, the first transmission in the first slot and the one or more transmissions received in the second slot may be directed to a third UE.

In example 24, the methods of examples 1-23 may include: transmitting, to the second UE, an indication of a transmit power to use for the second transmission, wherein the second gain is based at least in part on the indicated transmit power.

In example 25, in the methods of examples 1-24, the second gain is equal to the first gain.

Example 26 is a system or apparatus including means for implementing a method or realizing an apparatus as in any of examples 1-25.

Example 27 is a non-transitory computer-readable medium storing instructions executable by one or more processors to cause the one or more processors to implement a method as in any of examples 1-25.

Example 28 is a system including one or more processors and memory in electronic communication with the one or more processors storing instructions executable by the one or more processors to cause the system or apparatus to implement a method as in any of examples 1-25.

Techniques described herein may be used for various wireless communications systems such as code division multiple access (CDMA), time division multiple access (TDMA), frequency division multiple access (FDMA), orthogonal frequency division multiple access (OFDMA), single carrier frequency division multiple access (SC-FDMA), and other systems. A CDMA system may implement a radio technology such as CDMA2000, Universal Terrestrial Radio Access (UTRA), etc. CDMA2000 covers IS-2000, IS-95, and IS-856 standards. IS-2000 Releases may be commonly referred to as CDMA2000 1x, 1x, etc. IS-856 (TIA-856) is commonly referred to as CDMA2000 1xEV-DO, High Rate Packet Data (HRPD), etc. UTRA includes Wideband CDMA (WCDMA) and other variants of CDMA. A TDMA system may implement a radio technology such as Global System for Mobile Communications (GSM).

An OFDMA system may implement a radio technology such as Ultra Mobile Broadband (UMB), Evolved UTRA (E-UTRA), Institute of Electrical and Electronics Engineers (IEEE) 802.11 (Wi-Fi), IEEE 802.16 (WiMAX), IEEE 802.20, Flash-OFDM, etc. UTRA and E-UTRA are part of Universal Mobile Telecommunications System (UMTS). LTE, LTE-A, and LTE-A Pro are releases of UMTS that use E-UTRA. UTRA, E-UTRA, UMTS, LTE, LTE-A, LTE-A Pro, NR, and GSM are described in documents from the organization named "3rd Generation Partnership Project" (3GPP). CDMA2000 and UMB are described in documents from an organization named "3rd Generation Partnership Project 2" (3GPP2). The techniques described herein may be used for the systems and radio technologies mentioned herein as well as other systems and radio technologies. While aspects of an LTE, LTE-A, LTE-A Pro, or NR system may be described for purposes of example, and LTE, LTE-A, LTE-A Pro, or NR terminology may be used in much of the description, the techniques described herein are applicable beyond LTE, LTE-A, LTE-A Pro, or NR applications.

A macro cell generally covers a relatively large geographic area (e.g., several kilometers in radius) and may allow unrestricted access by UEs with service subscriptions with the network provider. A small cell may be associated with a lower-powered base station, as compared with a macro cell, and a small cell may operate in the same or different (e.g., licensed, unlicensed, etc.) frequency bands as macro cells. Small cells may include pico cells, femto cells, and micro cells according to various examples. A pico cell, for example, may cover a small geographic area and may allow unrestricted access by UEs with service subscriptions with the network provider. A femto cell may also cover a small geographic area (e.g., a home) and may provide restricted access by UEs having an association with the femto cell (e.g., UEs in a closed subscriber group (CSG), UEs for users in the home, and the like). An eNB for a macro cell may be referred to as a macro eNB. An eNB for a small cell may be referred to as a small cell eNB, a pico eNB, a femto eNB, or a home eNB. An eNB may support one or multiple (e.g., two, three, four, and the like) cells, and may also support communications using one or multiple component carriers.

The wireless communications systems described herein may support synchronous or asynchronous operation. For synchronous operation, the base stations may have similar frame timing, and transmissions from different base stations may be approximately aligned in time. For asynchronous operation, the base stations may have different frame timing, and transmissions from different base stations may not be aligned in time. The techniques described herein may be used for either synchronous or asynchronous operations.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA, or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media may include RAM, ROM, electrically erasable programmable ROM (EEPROM), flash memory, compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

As used herein, including in the claims, "or" as used in a list of items (e.g., a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label, or other subsequent reference label.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method for wireless communication at a first user equipment (UE), comprising:
   adjusting a receiver at the first UE, during a first slot, from a first gain configured at a temporal beginning of the first slot to a second gain, the adjusting based at least in part on a signal power observed during the first slot;
   decoding a first transmission received in the first slot based at least in part on adjusting the receiver at the UE to the second gain;
   determining, based at least in part on decoding the first transmission, whether to monitor for a second transmission from an second UE in a second slot;
   configuring, based at least in part on determining whether to monitor for the second transmission, the receiver to have a third gain at a temporal beginning of the second slot that is based at least in part on the second gain; and
   decoding one or more transmissions received in the second slot based at least in part on the receiver having the third gain at the temporal beginning of the second slot.

2. The method of claim 1,
   wherein a difference between the third gain and the first gain is based at least in part on a signal power associated with the first transmission.

3. The method of claim 2, further comprising:
   determining the first gain based at least in part on a plurality of gains used to decode a plurality of transmissions over a plurality of slots prior to the first slot.

4. The method of claim 3, wherein determining the first gain based at least in part on the plurality of gains comprises performing a statistical analysis of the plurality of gains.

5. The method of claim 1, wherein decoding the one or more transmissions received in the second slot comprises:
   adjusting the receiver, during the second slot, from having the third gain to having a fourth gain based at least in part on a second signal power observed during the second slot; and
   decoding the one or more transmissions based at least in part on adjusting the receiver to have the fourth gain.

6. The method of claim 1, wherein the third gain is further based at least in part on one or more of a total received signal power observed by the first UE in the first slot, a reference signal received power (RSRP) observed by the first UE for the second UE in the first slot, a spatial configuration used by the first UE for reception in the first slot, or a spatial configuration used for reception by the first UE in the second slot.

7. The method of claim 6, further comprising:
   determining, based at least in part on the RSRP for the second UE, a fraction of the total received signal power associated with the second UE, wherein the third gain is based at least in part on the fraction.

8. The method of claim 7, further comprising:
   determining that the fraction is above a threshold; and
   configuring the receiver to have the third gain at the temporal beginning of the second slot based at least in part on determining that the fraction is above the threshold.

9. The method of claim 6, further comprising:
   determining that the spatial configuration used for reception in the first slot is different from the spatial configuration used for reception in the second slot; and
   determining the third gain based at least in part on determining that the spatial configuration for reception in the first slot is different from the spatial configuration for reception in the second slot.

10. The method of claim 6, wherein the total received signal power comprises a received signal strength indicator (RSSI) for the first slot.

11. The method of claim 1, wherein the first transmission comprises an indication of the second slot.

12. The method of claim 11, wherein the first transmission comprises a control transmission.

13. The method of claim 12, wherein the second slot is immediately subsequent to the first slot, and wherein the indication of the second slot comprises a number of slots over which the second UE intends to transmit.

14. The method of claim 13, wherein the second slot comprises a data transmission from the second UE.

15. The method of claim 12, wherein at least one slot occurs between the first slot and the second slot, and wherein the indication of the second slot comprises an indication of a reserved resource that includes the second slot.

16. The method of claim 1, wherein the first transmission comprises an indication of whether a spatial configuration used by the first UE for reception in the first slot is the same as a spatial configuration used by the first UE for reception in the second slot.

17. The method of claim 1, further comprising:
    failing to decode at least one of one or more transmissions received from the second UE in the first slot, wherein the third gain is based at least in part on failing to decode the at least one of the one or more transmissions received in the first slot.

18. The method of claim 17, further comprising:
    transmitting a negative acknowledgement (NACK) to the second UE after failing to decode the at least one of the one or more transmissions received in the first slot.

19. The method of claim 18, further comprising:
    determining to monitor for the second transmission from the second UE based at least in part on transmitting the NACK.

20. The method of claim 1, further comprising:
    decoding all of one or more transmissions received from the second UE in the first slot, wherein the third gain is based at least in part on decoding all of the one or more transmissions received from the second UE in the first slot.

21. The method of claim 20, further comprising:
determining to not monitor for the second transmission from the second UE after decoding all of the one or more transmissions received from the second UE in the first slot.

22. The method of claim 20, wherein the third gain is a default initial gain.

23. The method of claim 1, wherein the first transmission in the first slot and the one or more transmissions received in the second slot are directed to a third UE.

24. The method of claim 1, further comprising:
transmitting, to the second UE, an indication of a transmit power to use for the second transmission, wherein the third gain is based at least in part on the indicated transmit power.

25. The method of claim 1, wherein the third gain is equal to the second gain.

26. An apparatus for wireless communication at a first user equipment (UE), comprising: a processor, memory in electronic communication with the processor; and instructions stored in the memory and executable by the processor to cause the apparatus to:
adjust a receiver at the first UE, during a first slot, from a first gain configured at a temporal beginning of the first slot to a second gain, the adjusting based at least in part on a signal power observed during the first slot;
decode a first transmission received in the first slot based at least in part on adjusting the receiver at the UE to the second gain;
determine, based at least in part on decoding the first transmission, whether to monitor for a second transmission from an second UE in a second slot;
configure, based at least in part on determining whether to monitor for the second transmission, the receiver to have a third gain at a temporal beginning of the second slot that is based at least in part on the second gain; and
decode one or more transmissions received in the second slot based at least in part on the receiver having the third gain at the temporal beginning of the second slot.

27. The apparatus of claim 26,
wherein a difference between the third gain and the first gain is based at least in part on a signal power associated with the first transmission.

28. The apparatus of claim 27, wherein the instructions are further executable by the processor to cause the apparatus to:
determine the first gain based at least in part on a plurality of gains used to decode a plurality of transmissions over a plurality of slots prior to the first slot, wherein determining the first gain based at least in part on the plurality of gains comprises performing a statistical analysis of the plurality of gains.

29. The apparatus of claim 26, wherein the instructions to decode the one or more transmissions received in the second slot are executable by the processor to cause the apparatus to:
adjust the receiver, during the second slot, from having the third gain to having a fourth gain based at least in part on a second signal power observed during the second slot; and
decode the one or more transmissions based at least in part on adjusting the receiver to have the fourth gain.

30. The apparatus of claim 26, wherein the third gain is further based at least in part on one or more of a total received signal power observed by the first UE in the first slot, a reference signal received power (RSRP) observed by the first UE for the second UE in the first slot, a spatial configuration used by the first UE for reception in the first slot, or a spatial configuration used for reception by the first UE in the second slot.

31. The apparatus of claim 30, wherein the instructions are further executable by the processor to cause the apparatus to:
determine, based at least in part on the RSRP for the second UE, a fraction of the total received signal power associated with the second UE, wherein the third gain is based at least in part on the fraction.

32. The apparatus of claim 31, wherein the instructions are further executable by the processor to cause the apparatus to:
determine that the fraction is above a threshold; and
configure the receiver to have the third gain at the temporal beginning of the second slot based at least in part on determining that the fraction is above the threshold.

33. The apparatus of claim 30, wherein the instructions are further executable by the processor to cause the apparatus to:
determine that the spatial configuration used for reception in the first slot is different from the spatial configuration used for reception in the second slot; and
determine the third gain based at least in part on determining that the spatial configuration for reception in the first slot is different from the spatial configuration for reception in the second slot.

34. The apparatus of claim 30, wherein the total received signal power comprises a received signal strength indicator (RSSI) for the first slot.

35. The apparatus of claim 26, wherein the first transmission comprises an indication of the second slot.

36. The apparatus of claim 35, wherein the first transmission comprises a control transmission.

37. The apparatus of claim 36, wherein the second slot is immediately subsequent to the first slot, and wherein the indication of the second slot comprises a number of slots over which the second UE intends to transmit, and wherein the second slot comprises a data transmission from the second UE.

38. The apparatus of claim 36, wherein at least one slot occurs between the first slot and the second slot, and wherein the indication of the second slot comprises an indication of a reserved resource that includes the second slot.

39. The apparatus of claim 26, wherein the first transmission comprises an indication of whether a spatial configuration used by the first UE for reception in the first slot is the same as a spatial configuration used by the first UE for reception in the second slot.

40. The apparatus of claim 26, wherein the instructions are further executable by the processor to cause the apparatus to:
fail to decode at least one of one or more transmissions received from the second UE in the first slot, wherein the third gain is based at least in part on failing to decode the at least one of the one or more transmissions received in the first slot.

41. The apparatus of claim 40, wherein the instructions are further executable by the processor to cause the apparatus to:
transmit a negative acknowledgement (NACK) to the second UE after failing to decode the at least one of the one or more transmissions received in the first slot.

42. The apparatus of claim 40, wherein the instructions are further executable by the processor to cause the apparatus to:

determine to monitor for the second transmission from the second UE based at least in part on transmitting the NACK.

43. The apparatus of claim 26, wherein the instructions are further executable by the processor to cause the apparatus to:
decode all of one or more transmissions received from the second UE in the first slot, wherein the third gain is based at least in part on decoding all of the one or more transmissions received from the second UE in the first slot.

44. The apparatus of claim 43, wherein the instructions are further executable by the processor to cause the apparatus to:
determine to not monitor for the second transmission from the second UE after decoding all of the one or more transmissions received from the second UE in the first slot.

45. The apparatus of claim 43, wherein the third gain is a default initial gain.

46. The apparatus of claim 26, wherein the first transmission in the first slot and the one or more transmissions received in the second slot are directed to a third UE.

47. The apparatus of claim 26, wherein the instructions are further executable by the processor to cause the apparatus to:
transmit, to the second UE, an indication of a transmit power to use for the second transmission, wherein the third gain is based at least in part on the indicated transmit power.

48. The apparatus of claim 26, wherein the third gain is equal to the second gain.

49. An apparatus for wireless communication at a first user equipment (UE), comprising:
means for adjusting a receiver at the first UE, during a first slot, from a first gain configured at a temporal beginning of the first slot to a second gain, the adjusting based at least in part on a signal power observed during the first slot;
means for decoding a first transmission received in the first slot based at least in part on adjusting the receiver at the UE to the second gain;
means for determining, based at least in part on decoding the first transmission, whether to monitor for a second transmission from an second UE in a second slot;
means for configuring, based at least in part on determining whether to monitor for the second transmission, the receiver to have a third gain at a temporal beginning of the second slot that is based at least in part on the second gain; and
means for decoding one or more transmissions received in the second slot based at least in part on the receiver having the third gain at the temporal beginning of the second slot.

50. A non-transitory computer-readable medium storing code for wireless communication at a first user equipment (UE), the code comprising instructions executable by a processor to:
adjust a receiver at the first UE, during a first slot, from a first gain configured at a temporal beginning of the first slot to a second gain, the adjusting based at least in part on a signal power observed during the first slot;
decode a first transmission received in the first slot based at least in part on adjusting the receiver at the UE to the second gain;
determine, based at least in part on decoding the first transmission, whether to monitor for a second transmission from an second UE in a second slot;
configure, based at least in part on determining whether to monitor for the second transmission, the receiver to have a third gain at a temporal beginning of the second slot that is based at least in part on the second gain; and
decode one or more transmissions received in the second slot based at least in part on the receiver having the third gain at the temporal beginning of the second slot.

* * * * *